United States Patent
Lee

(10) Patent No.: US 10,433,469 B1
(45) Date of Patent: Oct. 1, 2019

(54) SEMICONDUCTOR PACKAGE AND SEMICONDUCTOR MODULE

(71) Applicant: Samsung Electronics Co., Ltd., Suwon-si, Gyeonggi-do (KR)

(72) Inventor: Joungphil Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/131,596

(22) Filed: Sep. 14, 2018

(30) Foreign Application Priority Data

Mar. 9, 2018 (KR) ........................ 10-2018-0028026

(51) Int. Cl.
  *H01L 23/552* (2006.01)
  *H05K 9/00* (2006.01)
  *H01L 23/31* (2006.01)
  *B32B 17/06* (2006.01)
  *B32B 15/04* (2006.01)
  *B32B 7/12* (2006.01)

(52) U.S. Cl.
  CPC .............. *H05K 9/0086* (2013.01); *B32B 7/12* (2013.01); *B32B 15/04* (2013.01); *B32B 17/064* (2013.01); *H01L 23/3114* (2013.01); *H01L 23/3128* (2013.01); *H01L 23/552* (2013.01); *H05K 9/0094* (2013.01)

(58) Field of Classification Search
  CPC .................................................... H01L 23/552
  See application file for complete search history.

(56) References Cited

U.S. PATENT DOCUMENTS

| | | | |
|---|---|---|---|
| 7,393,472 B2 | 7/2008 | Lee et al. | |
| 7,642,469 B2 | 1/2010 | Arakawa et al. | |
| 8,350,451 B2 | 1/2013 | Bright et al. | |
| 8,455,086 B2 | 6/2013 | Inuduka et al. | |
| 2015/0116958 A1* | 4/2015 | Shedletsky | H05K 5/065 361/748 |
| 2016/0113161 A1 | 4/2016 | Ball et al. | |
| 2017/0265338 A1 | 9/2017 | Kim et al. | |
| 2017/0323838 A1* | 11/2017 | Otsubo | H01L 23/14 |

FOREIGN PATENT DOCUMENTS

| | | |
|---|---|---|
| JP | 2007531233 A | 11/2007 |
| JP | 2015023284 A | 2/2015 |
| KR | 100749565 B1 | 8/2007 |
| KR | 20080111944 A | 12/2008 |
| KR | 101147536 B1 | 5/2012 |
| KR | 101289768 B1 | 7/2013 |
| KR | 20170106071 A | 9/2017 |

\* cited by examiner

*Primary Examiner* — Hung V Ngo
(74) *Attorney, Agent, or Firm* — Harness, Dickey & Pierce, P.L.C.

(57) ABSTRACT

A semiconductor package including a package substrate including a ground layer, a first segment of which is exposed to outside the package substrate, a semiconductor chip on the package substrate, and a functional layer including a conductive polymer and an adhesive polymer, covering the semiconductor chip, and being in contact with the first segment of the ground layer may be provided.

17 Claims, 21 Drawing Sheets

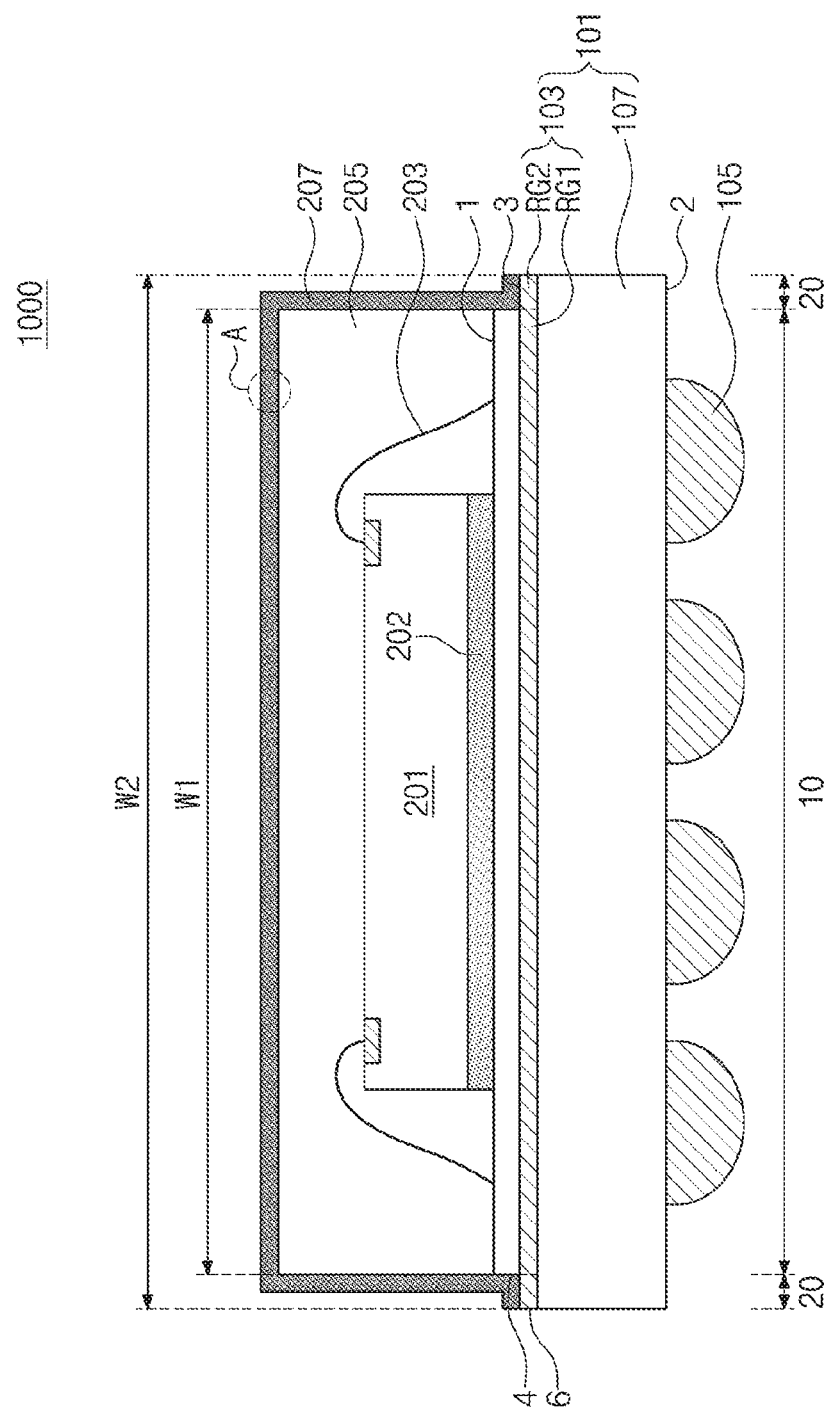

SEMICONDUCTOR PACKAGE AND SEMICONDUCTOR MODULE

CROSS-REFERENCE TO RELATED APPLICATION

This U.S. nonprovisional application claims priority under 35 U.S.C § 119 to Korean Patent Application No. 10-2018-0028026 filed on Mar. 9, 2018, in the Korean Intellectual Property Office, the entire contents of which are hereby incorporated by reference.

BACKGROUND

Inventive concepts relate to semiconductor packages and/or semiconductor modules, and more particularly, to semiconductor packages and/or a semiconductor modules that include a functional layer having transparency, adhesiveness, and high electrical conductivity.

As the mobile market expands, research on electromagnetic waves emitted from electronic devices is being actively conducted. For many kinds of electronic products, electromagnetic wave emission from semiconductor packages may cause problems with other nearby semiconductor packages. The electromagnetic interference may result in various malfunctions, operation abnormality, operation failure, etc.

Various types of semiconductor packages have been developed to meet increasing demands for high speed and dense semiconductor packages, however the electromagnetic interference issues persist.

SUMMARY

Some example embodiments of the inventive concepts provide semiconductor packages fabricated at a low cost, having a small thickness, and without environmental and residue issues.

Some example embodiments of the inventive concepts provide semiconductor packages each including semiconductor chip, a mark on which has can be visually recognized.

According to an example embodiments of the inventive concepts, a semiconductor package may include a package substrate including an insulating layer and a ground layer, the ground layer longitudinally extending in the insulating layer, an end portion of the ground layer exposed by the insulating layer, a semiconductor chip on the package substrate, a molding layer on the package substrate and surrounding at least a side surface of the semiconductor chip, and an electromagnetic shield layer covering the molding layer and the semiconductor chip, an end portion of the electromagnetic shield layer running in parallel with and being in contact with the end portion of the ground layer, the electromagnetic shield layer including a first lateral portion and a second lateral portion, the first lateral portion facing the side surface of the semiconductor chip, a second lateral portion at an end of the electromagnetic shield layer and horizontally spaced apart from the first lateral portion, the second lateral portion of the electromagnetic shield layer and a lateral end surface of the ground layer being on a substantially straight line and exposed to outside of the package substrate According to an example embodiments of the inventive concepts, a semiconductor package may include a package substrate including an insulating layer and a ground layer, the ground layer longitudinally extending in the insulating layer, an end portion of the ground layer exposed by the insulating layer, a semiconductor chip on the package substrate, a molding dam extending upward from a top surface of the package substrate, the molding dam horizontally spaced apart from the semiconductor chip, a window layer supported by the molding dam, the window layer and the molding dam enclosing the semiconductor chip on the package substrate, the window layer being transparent, and an electromagnetic shield layer covering the molding dam and the window layer, the electromagnetic shield layer including an end portion that runs in parallel with and is in contact with the exposed end portion of the ground layer, the electromagnetic shield layer further including a first lateral portion and a second lateral portion, the first lateral portion facing a side surface of the semiconductor chip, the second lateral portion at an end of the electromagnetic shield layer and horizontally spaced apart from the first lateral portion, the second lateral portion of the electromagnetic shield layer and a lateral end surface of the ground layer being on a substantially straight line and exposed to outside of the package substrate.

According to an example embodiments of the inventive concepts, a semiconductor package may include a module substrate, a plurality of electronic components on the module substrate, the electronic components including one or more semiconductor chips, a plurality of under-fill resin layers between the module substrate and respective ones of the plurality of electronic components, and an electromagnetic shield layer covering top and side surfaces of the electronic components and lateral surface of the plurality of under-fill resin layers, the electromagnetic shield layer including a plurality of upper portions on respective top surfaces of the plurality of electronic components, a plurality of first lateral portions on respective side surfaces of the plurality of electronic components, a plurality of second lateral portions on respective lateral surface of the plurality of under-fill resin layers, and a plurality of lower portions on a top surface of the module substrate, a vertically connected pair of one of the plurality of first lateral portions and one of the plurality of second lateral portions connecting a corresponding one of the plurality of upper portions to a corresponding one of the plurality of lower portions.

According to an example embodiments of the inventive concepts, a semiconductor package prepared by a method may include providing a package substrate including an insulating layer and a ground layer longitudinally extending within the insulating layer, providing a plurality of semiconductor chips on a top surface of the package substrate to be spaced apart from each other, providing a molding layer on the package substrate to surround at least a side surface of the semiconductor chip and to have a substantially flat top surface, cutting a molding layer between the plurality of semiconductor chips until the ground layer in the package substrate is exposed such that a plurality of grooves are formed between neighboring ones of the plurality of semiconductor chips, sequentially providing an electromagnetic shield layer and a cushion layer on the molding layer and the semiconductor chips, processing the cushion layer and the electromagnetic shield layer (1) to cause the electromagnetic shield layer to conformally cover top and lateral surfaces of the molding layer and (2) to cause the cushion layer to fill the grooves, side and bottom surfaces of which are conformally covered by the electromagnetic shield layer, removing the cushion layer, and cutting the package substrate in the plurality of grooves to form individual semiconductor packages such that in each of the individual semiconductor packages, (1) an end portion of the electromagnetic shield layer runs in parallel with the end portion of the ground layer and is in contact with the end portion of the ground layer, (2)

the electromagnetic shield layer includes a first lateral portion and a second lateral portion, the first lateral portion facing the side surface of the semiconductor chip, the second lateral portion at an end of the electromagnetic shield layer and horizontally spaced apart from the first lateral portion, the second lateral portion of the electromagnetic shield layer and a lateral end surface of the ground layer being on a substantially straight line and exposed to outside of the package substrate.

BRIEF DESCRIPTION OF THE DRAWINGS

FIG. 1A illustrates a cross-sectional view showing a semiconductor package according to an example embodiment of the inventive concepts.

DETAILED DESCRIPTION

Figure 1B:
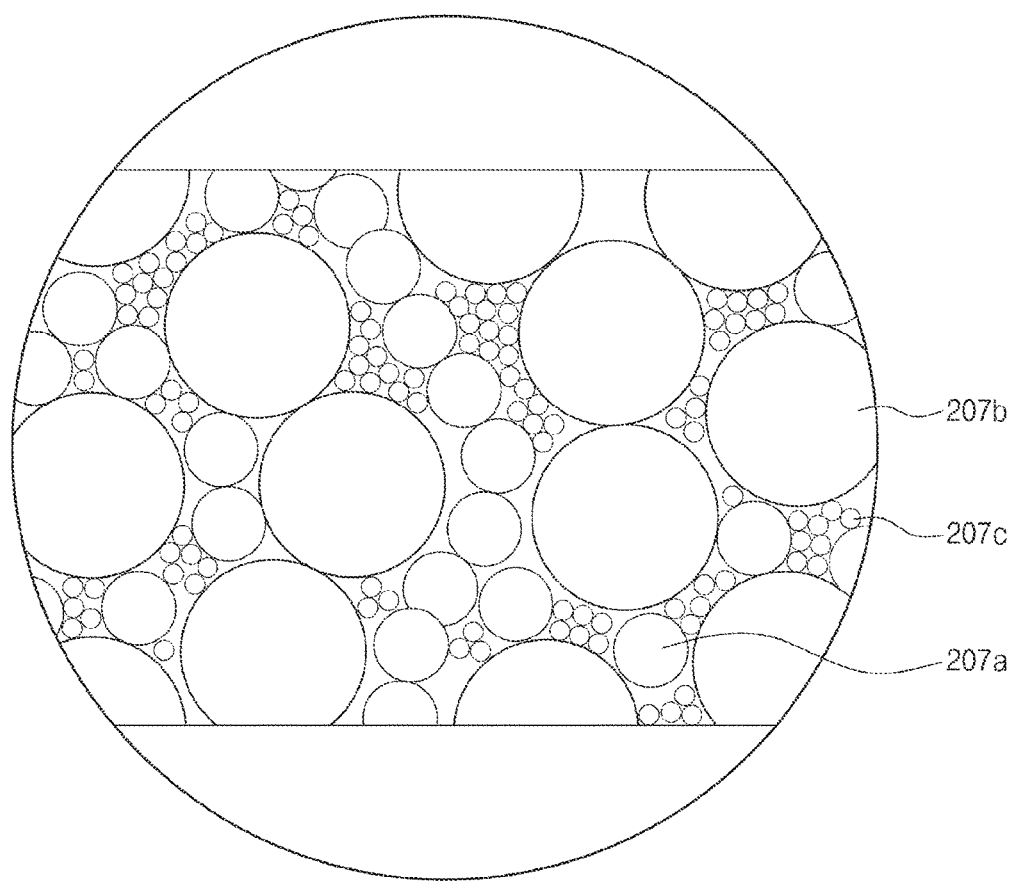
FIG. 1B illustrates an enlarged view showing section A of FIG. 1A.

FIG. 1A illustrates a cross-sectional view showing a semiconductor package according to an example embodiment of the inventive concepts. FIG. 1B illustrates an enlarged view showing section A of FIG. 1A.

Referring to FIGS. 1A and 1B, a semiconductor package 1000 may include a package substrate 101, external terminals 105, a semiconductor chip 201, bonding wires 203, a molding layer 205, and a functional layer 207.

The package substrate 101 may be or include a printed circuit board (PCB) with a circuit pattern. The package substrate 101 may include a first region 10 and a second region 20. The second region 20 of the package substrate 101 may surround the first region 10 of the package substrate 101. The package substrate 101 may include a first top surface 1, a second top surface 3, and a bottom surface 2. The package substrate 101 may be configured such that the first top surface 1 is positioned on the first region 10 and the second top surface 3 is positioned on the second region 20. The second top surface 3 of the package substrate 101 may be located at a level different from that of the first top surface 1 of the package substrate 101. For example, the second top surface 3 of the package substrate 101 may be located at a level lower than that of the first top surface 1 of the package substrate 101.

The package substrate 101 may include a ground layer 103 and an insulating layer 107. The ground layer 103 may longitudinally extend in the insulating layer 107, and an end portion of the ground layer 103 may be exposed by the insulating layer 107. The ground layer 103 may be disposed on both the first and second regions 10 and 20 of the package substrate 101. The ground layer 103 may be disposed below first lateral surfaces 4 of the first region 10 of the package substrate 101. The ground layer 103 may include a first segment RG1 on the first region 10 and a second segment RG2 on the second region 20. For example, as illustrated, the second segment RG2 of the ground layer 103 may have a top surface (e.g., the second top surface 3) and second lateral surfaces 6, which surfaces 3 and 6 may be exposed to outside the package substrate 101. In some example embodiments, the second lateral surfaces 6 of the second segment RG2 of the ground layer 103 may be exposed to outside the package substrate 101, and the second top surface 3 of the second segment RG2 of the ground layer 103 may not be exposed to outside the package substrate 101. The second segment RG2 of the ground layer 103 may be defined as a ground terminal. The ground layer 103 may include a conductive material. For example, the conductive material may include a metallic material (e.g., silver (Ag), gold (Au), or copper (Cu)), a metal alloy (e.g., copper-silver (Cu—Ag), titanium-silver-copper (Ti—Ag—Cu), or copper-zinc (Cu—Zn)), or other electrically conductive materials.

The external terminals 105 may be disposed on the bottom surface 2 of the package substrate 101. The external terminals 105 may be, but not limited to, a solder ball, a conductive bump, a conductive spacer, or a pin grid array.

The ground layer 103 may be electrically connected to a specific one of the external terminals 105. The specific external terminal 105 may be supplied with a ground voltage.

The semiconductor chip 201 may be disposed on the first top surface 1 of the package substrate 101. The semiconductor chip 201 may be placed on the first region 10 of the package substrate 101. The semiconductor chip 201 may be adhered through an adhesive layer 202 onto the first top surface 1 of the package substrate 101. For example, the semiconductor chip 201 may be a semiconductor logic chip, a semiconductor memory chip, a system-on-chip (SOC), or a lab-on-chip (LOC).

The semiconductor chip 201 and the package substrate 101 may be electrically connected to each other through the bonding wires 203 disposed therebetween. The bonding wires 203 may include, for example, one or more of gold (Au), silver (Ag), platinum (Pt), aluminum (Al), copper (Cu), palladium (Pd), nickel (Ni), cobalt (Co), chromium (Cr), and titanium (Ti). Although not shown, the semiconductor chip 201 may be mounted on the package substrate 101 in a flip-chip bonding manner or other possible manners.

The molding layer 205 may be disposed on the first region 10 of the package substrate 101. The molding layer 205 may cover the first top surface 1 of the first region 10 of the package substrate 101. The molding layer 205 may have lateral surfaces aligned with the first lateral surfaces 4 of the first region 10 of the package substrate 101. The molding layer 205 may surround at least a side surface of the semiconductor chip 201. In some example embodiments, the molding layer may surround a side surface of the semiconductor chip 201 and cover a top surface of the semiconductor chip 201. The molding layer 205 may have a width W1 less than a width W2 of the package substrate 101 (W1<W2). For example, the molding layer 205 may include an epoxy molding compound (EMC) or an under-fill material. A mark (not shown) may be displayed on a top surface of the molding layer 205. The mark may be or include one or more characters for expressing particular information.

The molding layer 205 may be covered (coated) with the functional layer 207 that extends onto the first lateral surfaces 4 of the first region 10 of the package substrate 101 and onto the second top surface 3 of the second segment RG2 of the ground layer 103. The functional layer 207 may be in contact with the second top surface 3 of the second segment RG2 of the ground layer 103. In some example embodiments, the molding layer 205 may be covered with the functional layer 207 that extends onto the second lateral surfaces 6 of the second segment RG2 of the ground layer 103. In such example embodiments, the functional layer 207 may be in contact with the second lateral surfaces 6 of the second segment RG2 of the ground layer 103, while being not in contact with the second top surface 3 of the second segment RG2 of the ground layer 103.

The functional layer 207 may have a uniform thickness. For example, a portion of the functional layer 207 covering the molding layer 205, a portion of the functional layer 207 covering the first lateral surfaces 4 of the first region 10 of the package substrate 101, and a portion of the functional layer 207 covering the second top surface 3 of the second segment RG2 of the ground layer 103 may have thicknesses that are substantially the same or substantially similar to each other. For example, the functional layer 207 may have a thickness equal to or less than about 40 μm.

The functional layer 207 may be an electromagnetic shield layer. Thus, the term "function layer" and "electromagnetic shield layer" may be interchangeably used throughout this disclosure. Referring again to FIG. 1A, the functional layer 207 may cover the molding layer 205 and the semiconductor chip 201. An end portion of the functional layer 207 may run in parallel with and is in contact with the end portion of the ground layer 103. The functional layer 207 may include a first lateral portion that faces the side surface of the semiconductor chip 201, and a second lateral portion that is provided at an end of the functional layer 207 and is horizontally spaced apart from the first lateral portion. The second lateral portion of the functional layer 207 and a lateral end surface of the ground layer 103 may be on a substantially straight line and exposed to outside of the package substrate. Thus the functional layer 207 may be electrically connected to the ground layer 103, and may provide an electrical path for grounding electromagnetic waves incident on the functional layer 207.

Referring back to FIG. 1B, the functional layer 207 may include a conductive polymer 207a and an adhesive polymer 207b. The conductive polymer 207a may have a relatively high electrical conductivity. For example, the conductive polymer 207a may have an electrical conductivity ranging from about 500 S/cm to about 2,000 S/cm. The conductive polymer 207a may be transparent. For example, the conductive polymer 207a may have a visible light transmittance equal to or higher than about 90%. For example, the conductive polymer 207a may include one or more of poly(3,4-ethylenedioxythiophene) (PEDOT), poly(3,4-ethylenedioxythiophene) (PEDOT): sodium poly-styrenesulfonate (PSS), and poly(4,4-dioctyl cyclopentadithiophene). The adhesive polymer 207b may have a relatively high adhesiveness. The adhesive polymer 207b may be transparent. For example, the adhesive polymer 207b may have a visible light transmittance equal to or higher than about 90%. For example, the adhesive polymer 207b may include one or more of acrylic polymer based mesoporous or acrylic microemulsion. The adhesive polymer 207b may include a photo-initiator. The photo-initiator may accelerate a cross-linking reaction of the adhesive polymer 207b when a curing process is performed.

The functional layer 207 may further include a conductive filler 207c. The conductive filler 207c may have an electrical conductivity greater than that of the conductive polymer 207a. For example, the conductive filler 207c may have an electrical conductivity ranging from about 5,000 S/cm to about 20,000 S/cm. The conductive filler 207c may be transparent. For example, the conductive filler 207c may have a visible light transmittance equal to or higher than about 90%. For example, the conductive filler 207c may include a transparent conductive oxide (TCO). For example, the conductive filler 207c may be an inorganic material including one or more of indium zinc oxide (IZO), indium tin oxide (ITO), and aluminum zinc oxide (AZO). In some example embodiments, the conductive filler 207c may be an organic material including one or more of carbon nanotube (CNT) and graphene. Because the functional layer 207 further includes the conductive filler 207c, the functional layer 207 may increase in electrical conductivity. In some example embodiments, the conductive filler 207c may have a flake shape. The conductive polymer 207a, the adhesive polymer 207b, and the conductive filler 207c may be irregularly arranged in the functional layer 207.

Because the functional layer 207 includes the conductive polymer 207a, the adhesive polymer 207b, and the conductive filler 207c, electrical conductivity and adhesiveness of the functional layer 207 may increase. Thus, the functional layer 207 may serve as a ground path for electromagnetic waves, and may be adhered to the molding layer 205 and the ground layer 103 without separately providing an adhesive. The functional layer 207 may be transparent. Thus, even when the functional layer 207 covers the molding layer 205, the mark printed on the top surface of the molding layer 205 may be visually recognized.

The functional layer 207 may cause the semiconductor package 1000 to be fabricated at a lower cost and/or to have a smaller thickness. The semiconductor package 1000 may have no metallic material for shielding electromagnetic waves, thereby resulting in reduction of environmental and residue issues.

Figure 2A:
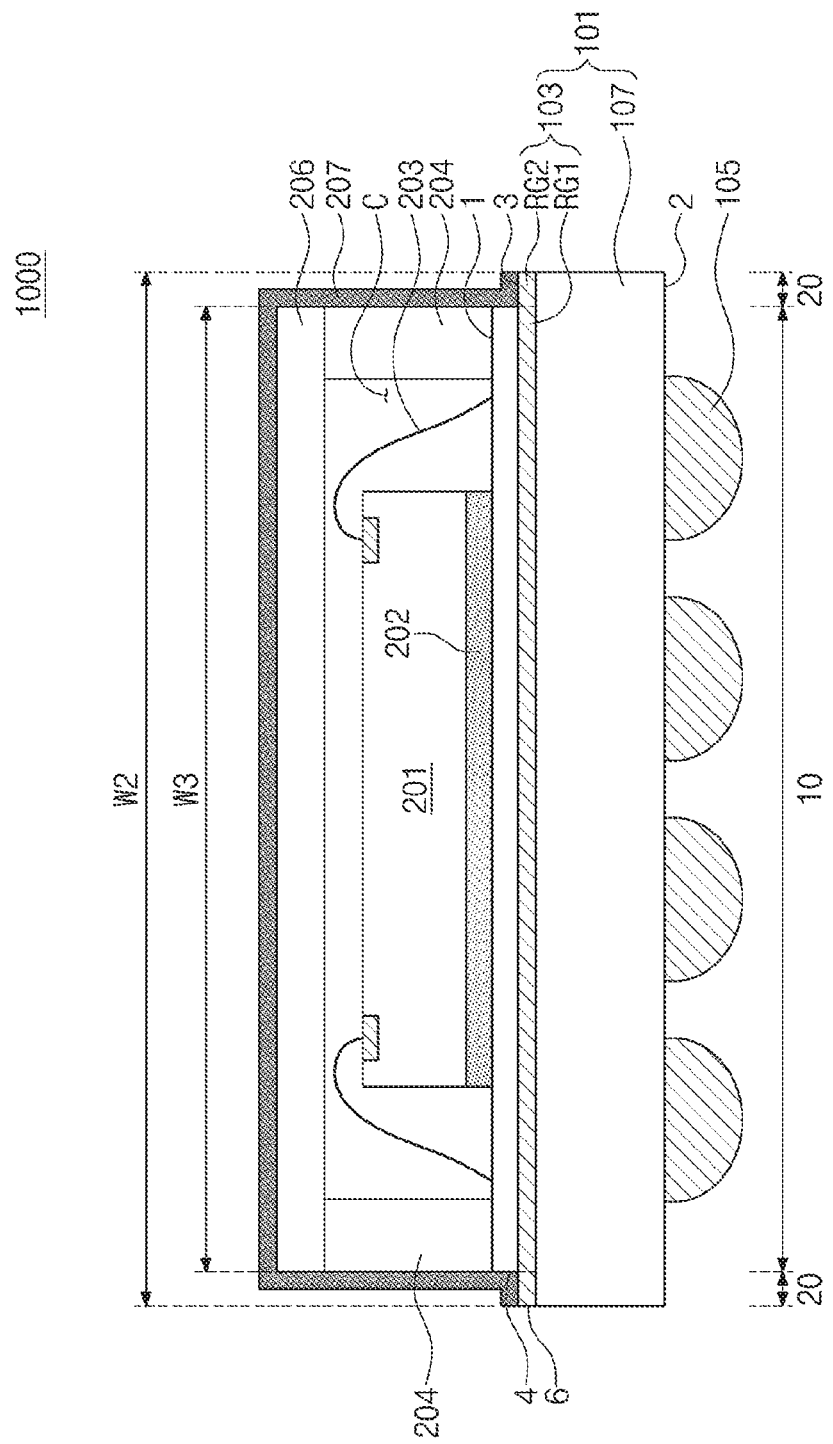
FIG. 2A illustrates a cross-sectional view showing a semiconductor package according to an example embodiment of the inventive concepts.

FIG. 2A illustrates a cross-sectional view showing a semiconductor package according to an example embodiment of the inventive concepts.

For brevity of description, constituents the same as or substantially to those discussed with reference to FIGS. 1A and 1B are allocated the same reference numerals thereto, and a repetitive explanation thereof will be omitted.

Referring to FIG. 2A, a semiconductor package 1000 may include a package substrate 101, external terminals 105, a semiconductor chip 201, bonding wires 203, a molding dam 204, a window layer 206, and a functional layer 207.

The package substrate 101 may be or include a printed circuit board (PCB) with a circuit pattern. The package substrate 101 may include a ground layer 103 and an insulating layer 107. The ground layer 103 may longitudinally extend in the insulating layer 107, and an end portion of the ground layer 103 may be exposed by the insulating layer 107. The external terminals 105 may be disposed on a bottom surface 2 of the package substrate 101.

The semiconductor chip 201 may be disposed on a first top surface 1 of the package substrate 101. The semiconductor chip 201 may be adhered through an adhesive layer 202 onto the first top surface 1 of the package substrate 101. For example, the semiconductor chip 201 may be a light emitting chip, an optical sensor chip, or a lab-on-chip (LOC). The semiconductor chip 201 and the package substrate 101 may be electrically connected to each other through the bonding wires 203 disposed therebetween.

The molding dam 204 may be disposed on a first region 10 of the package substrate 101. The molding dam 204 may be vertically under the functional layer 207, and may be horizontally within the functional layer 207. The molding dam 204 may extend upward from an edge of the first top surface 1 of the first region 10 of the package substrate 101. The molding dam 204 may have lateral surfaces aligned with first lateral surfaces 4 of the first region 10 of the package substrate 101. The molding dam 204 may be horizontally spaced apart from the semiconductor chip 201. When viewed in plan, the molding dam 204 may surround a side surface of the semiconductor chip 201. The molding dam 204 may have a width W3 less than a width W2 of the package substrate 101 (W3<W2). In other words, a distance W3 between a left outer wall and a right outer wall of the molding dam 204, when viewed in a cross-section, may be smaller than the width W2 of the package substrate 101. The top surface of the molding dam 204 may be at a higher level or position than a top of the semiconductor chip 201.

The window layer 206 may be disposed on the molding dam 204 and the semiconductor chip 201. The molding dam 204 may support the window layer 206. The window layer 206 may be spaced apart from the semiconductor chip 201. The window layer 206 and the molding dam 204 may enclose the semiconductor chip 201 on the package substrate 101. The window layer 206 may be transparent. For example, the window layer 206 may include glass.

A cavity C may be defined by the first top surface 1, the molding dam 204, and the window layer 206. For example, the cavity C may be an empty space surrounded by the first top surface 1, the molding dam 204, and the window layer 206. The semiconductor chip 201 may be disposed in the cavity C.

For example, as illustrated, the molding dam 204 and the window layer 206 may be covered with the functional layer 207 that extends onto the first lateral surfaces 4 of the first region 10 of the package substrate 101 and onto a second top surface 3 of a second segment RG2 of the ground layer 103. The functional layer 207 may include an end portion that runs in parallel with and is in contact with the exposed end portion of the ground layer 103. The functional layer 207 may include a first lateral portion that faces a side surface of the semiconductor chip 201 and a second lateral portion that is provided at an end of the functional layer 207 and is horizontally spaced apart from the first lateral portion. The second lateral portion of the functional layer 207 and a lateral end surface of the ground layer 103 may be on a substantially straight line and be exposed to outside of the package substrate 101. In some example embodiments, the molding dam 204 and the window layer 206 may be covered with the functional layer 207 that extends onto second lateral surfaces 6 of the second segment RG2 of the ground layer 103 while providing the functional layer 207 to be in contact with the ground layer 103. The functional layer 207 may include a conductive polymer 207a and an adhesive polymer 207b, as illustrated in FIG. 1B. The functional layer 207 may further include a conductive filler 207c, as illustrated in FIG. 1B.

Because the functional layer 207 includes the conductive polymer 207a, the adhesive polymer 207b, and the conductive filler 207c, electrical conductivity and adhesiveness of the functional layer 207 may increase. Thus, the functional layer 207 may serve as a ground path for electromagnetic waves, and may be adhered to the molding dam 204, the window layer 206, and the ground layer 103 without separately providing an adhesive. The window layer 206 and the functional layer 207 may be transparent. Therefore, in the case where the semiconductor chip 201 is a light emitting chip, light emitted from the semiconductor chip 201 may be radiated outward through the window layer 206 and the functional layer 207. In the case where the semiconductor chip 201 is an optical sensor chip, the semiconductor chip 201 may receive external light through the window layer 206 and the functional layer 207.

Figure 2B:
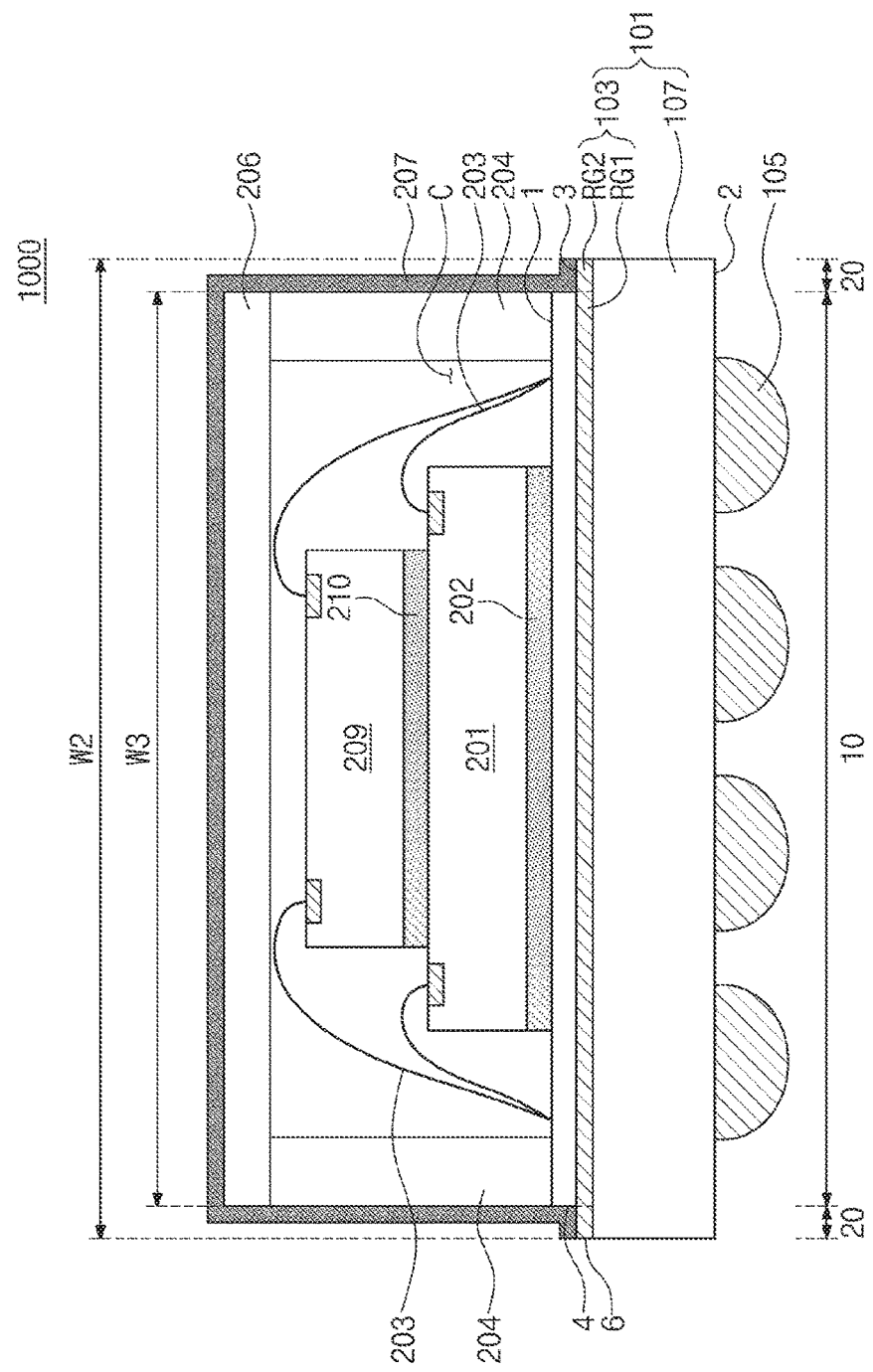
FIG. 2B illustrates a cross-sectional view showing a semiconductor package according to an example embodiment of the inventive concepts.

FIG. 2B illustrates a cross-sectional view showing a semiconductor package according to an example embodiment of the inventive concepts.

For brevity of description, constituents the same as or substantially similar to those discussed with reference to FIGS. 1A, 1B, and 2A are allocated the same reference numerals thereto, and a repetitive explanation thereof will be omitted.

Referring to FIG. 2B, a semiconductor package 1000 may include a package substrate 101, external terminals 105, a first semiconductor chip 201, a second semiconductor chip 209, bonding wires 203, a molding dam 204, a window layer 206, and a functional layer 207.

The first semiconductor chip 201 may be disposed on a first top surface 1 of the package substrate 101. The first semiconductor chip 201 may be adhered through a first adhesive layer 202 onto the first top surface 1 of the package substrate 101. For example, the first semiconductor chip 201 may be a semiconductor logic chip, a semiconductor memory chip, a system-on-chip (SOC), or a lab-on-chip (LOC). The first semiconductor chip 201 and the package substrate 101 may be electrically connected to each other through the bonding wires 203 disposed therebetween.

The second semiconductor chip 209 may be disposed on a top surface of the first semiconductor chip 201. The second semiconductor chip 209 may be adhered through a second adhesive layer 210 to the top surface of the first semiconductor chip 201. For example, the second semiconductor chip 209 may be a light emitting chip, an optical sensor chip, or a lab-on-chip (LOC). The second semiconductor chip 209 and the package substrate 101 may be electrically connected to each other through the bonding wires 203 disposed therebetween.

Although not shown, the semiconductor package 1000 may further include other semiconductor chips between the first and second semiconductor chips 201 and 209.

Figure 3A:
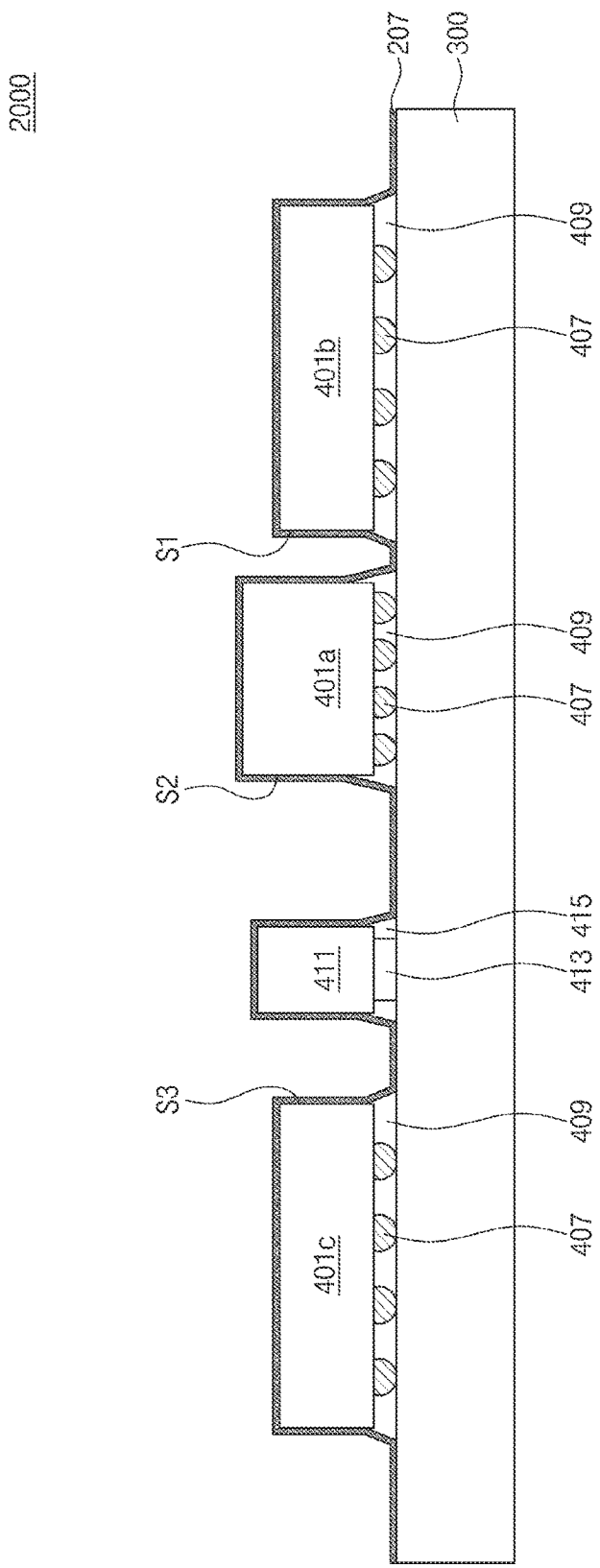
FIG. 3A illustrates a cross-sectional view showing a semiconductor module according to an example embodiment of the inventive concepts.

FIG. 3A illustrates a cross-sectional view showing a semiconductor module according to an example embodiment of the inventive concepts.

For brevity of description, constituents the same as or substantially similar to those discussed with reference to FIGS. 1A and 1B are allocated the same reference numerals thereto, and a repetitive explanation thereof will be omitted.

Referring to FIG. 3A, a semiconductor module 2000 may include a module substrate 300, and a first semiconductor chip 401a, a second semiconductor chip 401b, a third semiconductor chip 401c, a component 411, and a functional layer 207 on the module substrate 300. The first semiconductor chip 401a, the second semiconductor chip 401b, the third semiconductor chip 401c, and the component 411 may be collectively referred to as a plurality of electronic components.

The module substrate 300 may be or include a printed circuit board (PCB) with a circuit pattern. The first, second, and third semiconductor chips 401a, 401b, and 401c may be disposed on the module substrate 300. The first, second, and third semiconductor chips 401a, 401b, and 401c may have different heights from each other. Each of the first, second, and third semiconductor chips 401a, 401b, and 401c may be a semiconductor logic chip, a semiconductor memory chip, a system-on-chip (SOC), or a lab-on-chip (LOC).

A plurality of solder balls 407 may be disposed between the module substrate 300 and each of the first, second, and third semiconductor chips 401a, 401b, and 401c. The solder balls 407 may electrically connect between the module substrate 300 and each of the first, second, and third semiconductor chips 401a, 401b, and 401c. A first under-fill resin layer 409 may be disposed within a gap between the module substrate 300 and each of the first, second, and third semiconductor chips 401a, 401b, and 401c. The first under-fill resin layer 409 may surround surfaces of the solder balls 407. For example, the first under-fill resin layer 409 may include an under-fill material.

The component 411 may be disposed on the module substrate 300. For example, the component 411 may be disposed between the first semiconductor chip 401a and the third semiconductor chip 401c. The position of the component 411 is not limited to the above, but may be variously changed. The component 411 may be adhered through an adhesive layer 413 onto the module substrate 300. In some example embodiments, the component 411 may be replaced with a resistor, an inductor, a transformer, a passive device, or other electrical devices. The component 411 may have a height different from those of the first, second, and third semiconductor chips 401a, 401b, and 401c. A second under-fill resin layer 415 may be disposed between the component 411 and the module substrate 300, and may surround the adhesive layer 413.

The functional layer 207 may extend onto a top surface of the module substrate 300, while covering the first, second, and third semiconductor chips 401a, 401b, and 401c, lateral surfaces of a plurality of first under-fill resin layers 409, the component 411, and a lateral surface of the second under-fill resin layer 415. For example, the functional layer 207 may cover top and lateral surfaces of the first, second, and third semiconductor chips 401a, 401b, and 401c, surfaces of the plurality of first under-fill resin layers 409, and a surface of the second under-fill resin layer 415. The functional layer 207 may also cover top and lateral surfaces of the component 411.

The functional layer 207 may extend onto a top surface of the module substrate 300 exposed to a first space S1 between the first and second semiconductor chips 401a and 401b and onto a top surface of the module substrate 300 exposed to a second space S2 between the component 411 and the first semiconductor chip 401a. The functional layer 207 may extend onto a top surface of the module substrate 300 exposed to a third space S3 between the third semiconductor chip 401c and the component 411. The functional layer 207 may include a plurality of upper portions on respective top surfaces of the plurality of electronic components, a plurality of first lateral portions on respective side surfaces of the plurality of electronic components, a plurality of second lateral portions on respective lateral surface of the plurality of under-fill resin layers, and a plurality of lower portions on a top surface of the module substrate. A vertically connected pair of one of the plurality of first lateral portions and one of the plurality of second lateral portions may connect a corresponding one of the plurality of upper portions to a corresponding one of the plurality of lower portions. The functional layer 207 may include a conductive polymer 207a and an adhesive polymer 207b, as illustrated in FIG. 1B. The functional layer 207 may further include a conductive filler 207c, as illustrated in FIG. 1B.

A thickness of a portion of the functional layer 207 covering the top surface of the module substrate 300 may be the same as or substantially similar to a thickness of each of portions of the functional layer 207 covering the first, second, and third semiconductor chips 401a, 401b, and to 401c, the plurality of first under-fill resin layers 409, the component 411, and the second under-fill resin layer 415. For example, the functional layer 207 may have a thickness equal to or less than about 40 µm. Each of the first, second, and third spaces S1, S2, and S3 may have an aspect ratio equal to or less than about 5. The aspect ratio may correspond to a value obtained by dividing a depth (or height) of each of the first, second, and third spaces S1, S2, and S3 by a width of the each of the first, second, and third spaces S1, S2, and S3.

Figure 3B:
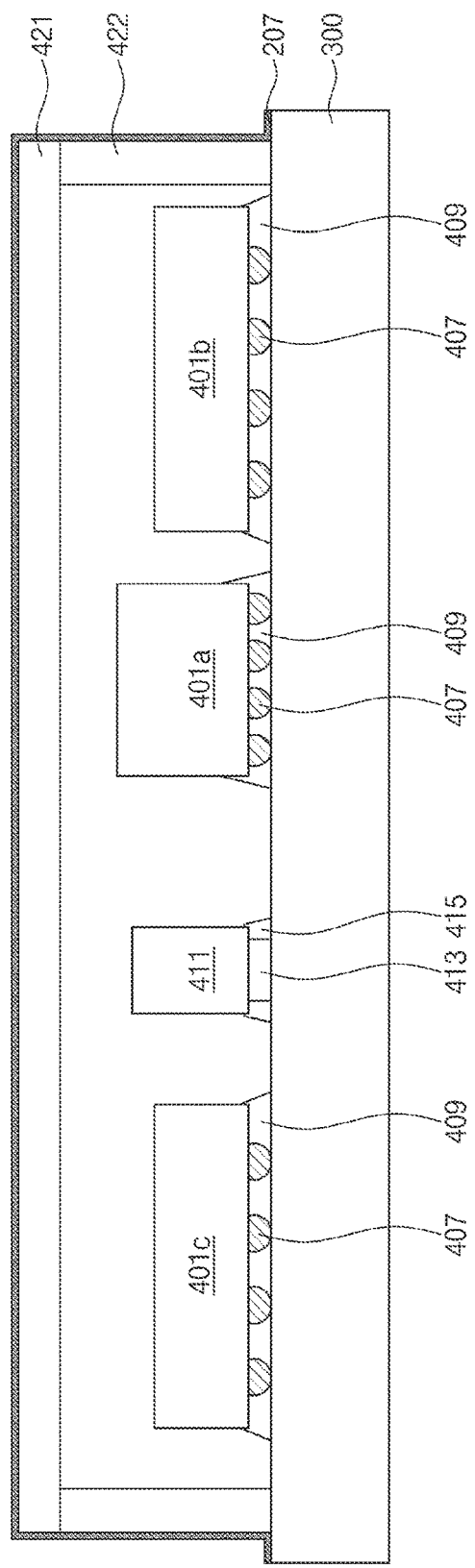
FIG. 3B illustrates a cross-sectional view showing a semiconductor module according to an example embodiment of the inventive concepts.

FIG. 3B illustrates a cross-sectional view showing a semiconductor module according to an example embodiment of the inventive concepts.

For brevity of description, constituents the same as or substantially similar to those discussed with reference to FIGS. 1A, 1B, and 3A are allocated the same reference numerals thereto, and a repetitive explanation thereof will be omitted.

Referring to FIG. 3B, a semiconductor module 2000 may include a module substrate 300, a first semiconductor chip 401a, a second semiconductor chip 401b, a third semiconductor chip 401c, a component 411, a functional layer 207, a molding dam 422, and a window layer 421.

The first, second, and third semiconductor chips 401a, 401b, and 401c may be disposed on the module substrate 300. Each of the first, second, and third semiconductor chips 401a, 401b, and 401c may be a light emitting chip, an optical sensor chip, or a lab-on-chip (LOC).

The component 411 may be disposed on the module substrate 300.

The molding dam 422 may be disposed on the module substrate 300. The molding dam 422 may extend upward from a top surface of the module substrate 300. The molding dam 422 may be spaced apart from the component 411 and from the first, second, and third semiconductor chips 401a, 401b, and 401c. When viewed in a plan view, the molding dam 422 may surround the component 411 and the first, second, and third semiconductor chips 401a, 401b, and 401c.

The window layer 421 may be disposed on the molding dam 422, the component 411, and the first, second, and third semiconductor chips 401a, 401b, and 401c. The molding dam 422 may support the window layer 421. The window layer 421 may be spaced apart from the component 411 and from the first, second, and third semiconductor chips 401a, 401b, and 401c. The window layer 421 may be transparent. For example, the window layer 421 may include glass.

The molding dam 422 and the window layer 421 may be covered with the functional layer 207 that extends onto a top surface of an edge of the module substrate 300. For example, the functional layer 207 may cover a top surface of the window layer 421, a lateral surface of the molding dam 422, and the top surface of an edge of the module substrate 300.

FIGS. 4A to 4E illustrate cross-sectional views showing a method of fabricating a semiconductor package according to an example embodiment of the inventive concepts.

For brevity of description, constituents the same as or substantially similar to those discussed with reference to FIGS. 1A and 1B are allocated the same reference numerals thereto, and a repetitive explanation thereof will be omitted.

Figure 4A:
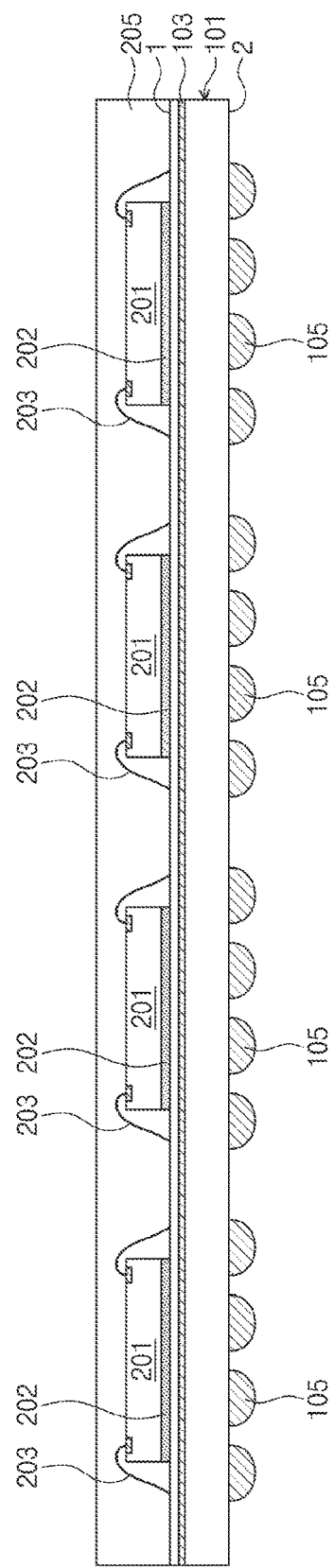
FIGS. 4A to 4E illustrate cross-sectional views showing a method of fabricating a semiconductor package according to an example embodiment of the inventive concepts.

Referring to FIG. 4A, a package substrate 101 may include a first top surface 1 and a bottom surface 2. The package substrate 101 may be or include a printed circuit board (PCB) with a circuit pattern. The package substrate 101 may include a ground layer 103. The ground layer 103 may be disposed within the package substrate 101. The ground layer 103 may include a conductive material. For example, the conductive material may include a metallic material (e.g., silver (Ag), gold (Au), or copper (Cu)), a metal alloy (e.g., copper-silver (Cu—Ag), titanium-silver-copper (Ti—Ag—Cu), or copper-zinc (Cu—Zn)), or other electrically conductive materials.

A plurality of semiconductor chips 201 may be provided on the first top surface 1 of the package substrate 101, while being spaced apart from each other, for example, at a regular interval. Each of the semiconductor chips 201 may be adhered through an adhesive layer 202 onto the package substrate 101. For example, the semiconductor chips 201 may be a semiconductor logic chip, a semiconductor memory chip, a system-on-chip (SOC), or a lab-on-chip (LOC).

A plurality of bonding wires 203 may be disposed between the package substrate 101 and each of the semiconductor chips 201. The bonding wires 203 may electrically connect the semiconductor chip 201 to the package substrate 101. For example, the bonding wires 203 may be formed of one or more of gold (Au), silver (Ag), platinum (Pt), aluminum (Al), copper (Cu), palladium (Pd), nickel (Ni), cobalt (Co), chromium (Cr), and titanium (Ti).

A molding layer 205 may be formed on the first top surface 1 of the package substrate 101. The molding layer 205 may cover the semiconductor chips 201. For example, the molding layer 205 may be formed of an epoxy molding compound (EMC) or an under-fill material. A plurality of external terminals 105 may be formed on the bottom surface 2 of the package substrate 101. In the case where the external terminals 105 are solder balls, a soldering process may be performed to form the external terminals 105 on the bottom surface 2 of the package substrate 101.

Figure 4B:
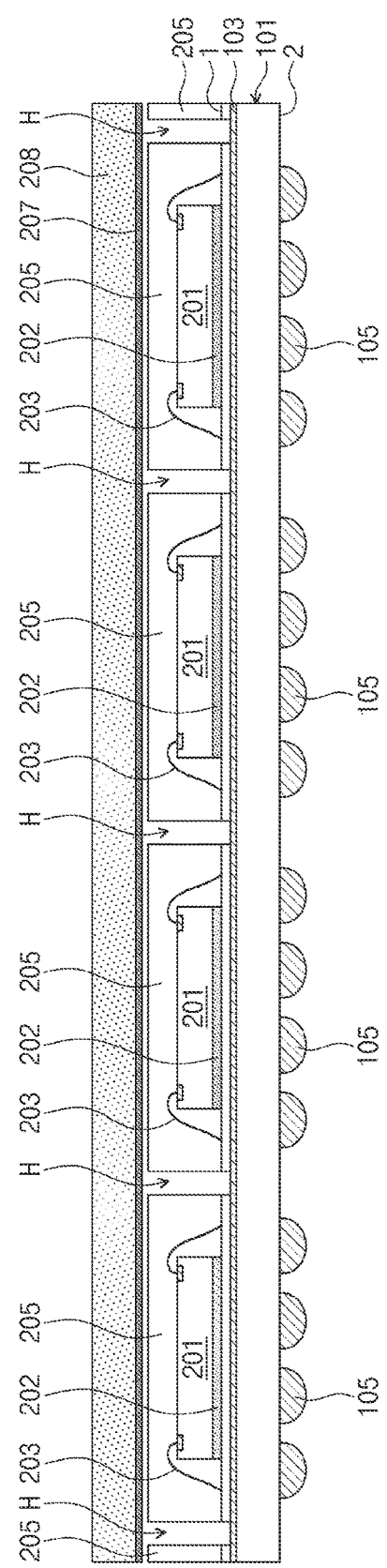

Referring to FIG. 4B, a cutting process may be performed on the molding layer 205 and the package substrate 101. The cutting process may partially cut the molding layer 205 between the semiconductor chips 201 and the package substrate 101 between the semiconductor chips 201. The cutting process may partially cut an edge of the molding layer 205 and an edge of the package substrate 101 overlapping the edge of the molding layer 205. The cutting process may form a groove H between a pair of neighboring semiconductor chips 201. The cutting process may form a groove H between a first edge of the molding layer 205 and an edge of the leftmost one of the semiconductor chips 201. The cutting process may form a groove H between a second edge of the molding layer 205 that is opposite to the first edge of the molding layer 205 and an edge of the rightmost one of the semiconductor chips 201. A pair of neighboring grooves H may define therebetween a region where a unit semiconductor package occupies. The groove H may have a floor surface lower than the first top surface 1 of the package substrate 101. For example, the groove H may have an aspect ratio equal to or less than about 5. The aspect ratio may correspond to a value obtained by dividing a depth (or height) of the groove H by a width of the groove H. The cutting process may separate the molding layer 205 into a plurality of pieces. The cutting process may continue until the ground layer 103 is exposed. After the cutting process, the ground layer 103 may be partially exposed to the groove H.

A functional layer 207 may be provided on the molding layer 205, and a cushion layer 208 may be provided on the functional layer 207.

The functional layer 207 may be an electromagnetic shield layer. The functional layer 207 may include a conductive polymer 207a and an adhesive polymer 207b, as illustrated in FIG. 1B. The functional layer 207 may further include a conductive filler 207c, as illustrate in FIG. 1B.

The following describes a method of forming the functional layer 207. The conductive polymer 207a, the adhesive polymer 207b, and the conductive filler 207c may be melted in a solvent to form a liquefied composition. For example, the solvent may include alcohol. The liquefied composition may be wet-coated to have a proper thickness, and then dried in an oven to evaporate the solvent from the liquefied composition. Therefore, the functional layer 207 may be formed to have the conductive polymer 207a, the adhesive polymer 207b, and the conductive filler 207c that are in solid state. For example, the functional layer 207 may have a thickness equal to or less than about 40 μm.

The cushion layer 208 may have a thickness ranging from about 50 μm to about 400 μm. The cushion layer 208 may include a polyethylene-based polymer or a polyurethane-based polymer. For example, the polyethylene-based polymer may include polymethylpentene (PMP), polyvinylchloride (PVC), or polybutyleneterephthalate (PBT). For example, the polyurethane-based polymer may include thermoplastic polyurethane (TPU).

Figure 4C:
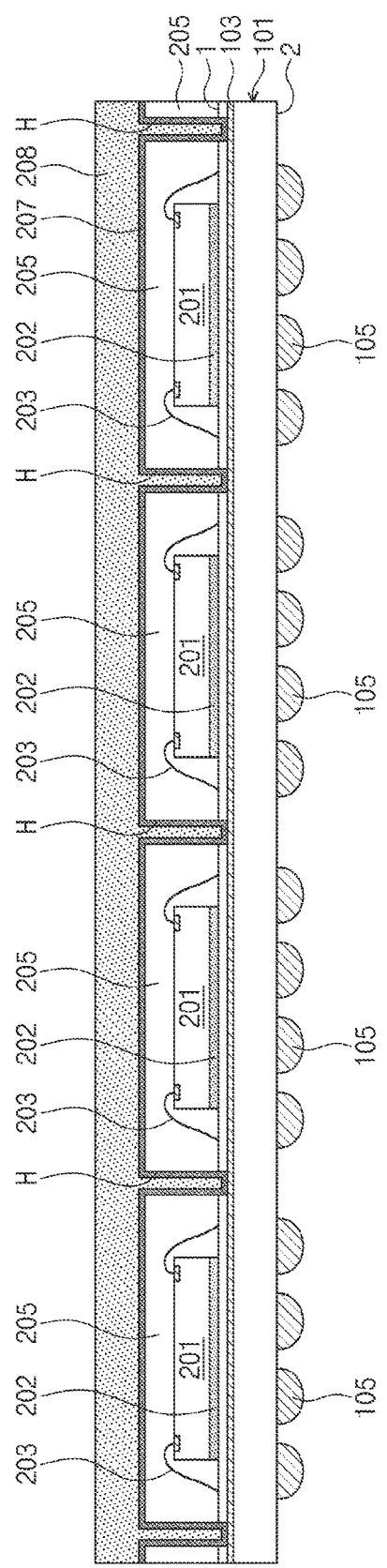

Referring to FIG. 4C, the functional layer 207 and the cushion layer 208 may be processed to cover the molding layers 205 and to fill the groove H. For example, the functional layer 207 may conformally cover top and lateral surfaces of the molding layers 205 and the floor surface of the groove H. The cushion layer 208 may cover the functional layer 207 and fill the groove H. A press process may be performed to cause the functional layer 207 and the cushion layer 208 to cover the surfaces of the molding layers 205 and to fill the groove H. The press process may be performed such that the functional layer 207 and the cushion layer 208 are heated and pressed against the package substrate 101 for about 5 minutes to about 15 minutes in a state that the functional layer 207 and the cushion layer 208 are provided on the molding layers 205. The press process may be performed under a pressure ranging from about 2 MPa to about 10 MPa at a temperature ranging from about 50° C. to about 150° C.

The cushion layer 208 may have decreased elastic modulus due to the heat and pressure such that the groove H may be easily filled with the cushion layer 208. The functional layer 207 may conformally cover the floor surface of the groove H and the lateral surfaces of the molding layers 205.

Figure 4D:
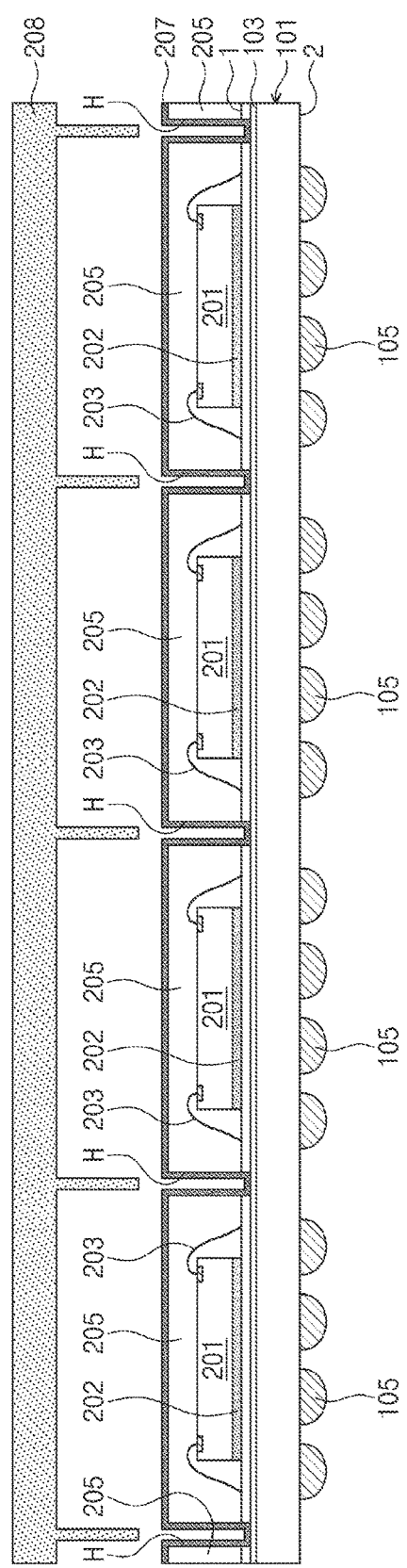

Referring to FIG. 4D, the cushion layer 208 may be removed from the functional layer 207. The press process may expand the cushion layer 208 and reduce the elastic modulus of the cushion layer 208, and therefore an external physical force may easily separate the cushion layer 208 from the functional layer 207. The functional layer 207 may remain on the surfaces of the molding layers 205 and the floor surface of the groove H. After the cushion layer 208 is removed, a curing process may be performed on the functional layer 207. The curing process may cure the functional layer 207. The curing process may irradiate an ultraviolet ray to the functional layer 207. The ultraviolet ray may have an intensity ranging from about 100 mJ to about 1,000 mJ. The ultraviolet ray may be irradiated for about 1 second to about 5 minutes. In the curing process, a photo-initiator of the adhesive polymer (see 207b of FIG. 1B) may accelerate a cross-linking process of the adhesive polymer 207b. The cross-linking process may be accelerated when the photo-initiator is irradiated with an ultraviolet ray whose wavelength ranges from about 300 nm to about 600 nm.

According to some example embodiments of inventive concepts, the functional layer 207 may conformally cover the top surfaces of the molding layers 205, and at the same time, conformally cover the floor surface and sidewalls of the groove H. The formation of the functional layer 207 may be performed prior to a package singulation process, such as a sawing or sorting process. Therefore, a process tim may be reduced compared to the case where the functional layer 207 is formed on each of semiconductor packages after the package singulation process (sawing or sorting).

Figure 4E:
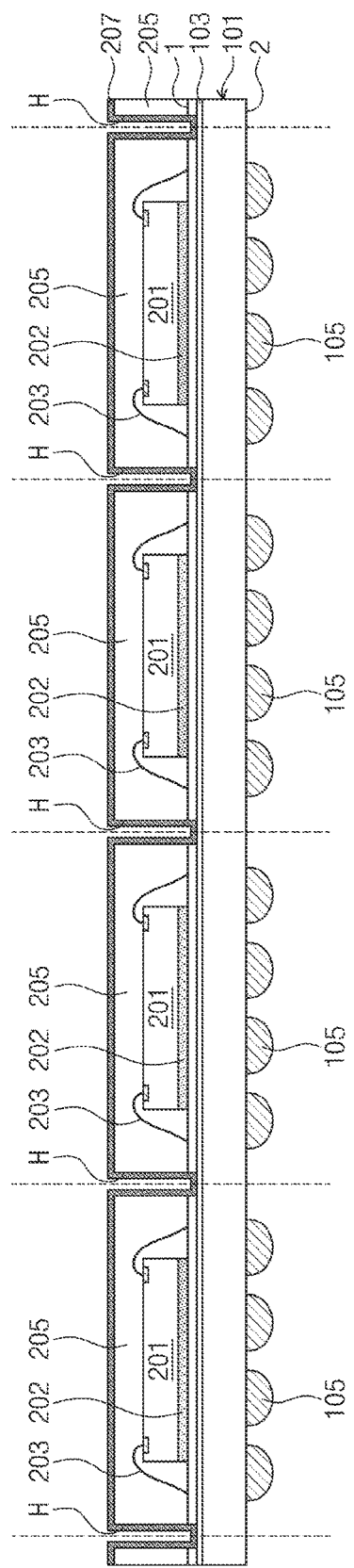

Referring to FIG. 4E, a package singulation process (sawing or sorting) may be performed within the groove H, thereby forming a plurality of semiconductor packages. If the package substrate 101 has a non-cut portion when the cutting process is performed, the package singulation process (sawing or sorting) may completely cut the non-cut portion of the package substrate 101. For example, the package singulation process (sawing or sorting) may cut the package substrate 101 along a scribe line which has a width less than that of the groove H, thereby mitigating or preventing the functional layer 207 formed on the lateral surfaces of the molding layers 205 from being removed.

FIGS. 5A to 5E illustrate cross-sectional views showing a method of fabricating a semiconductor package according to an example embodiment of the inventive concepts.

For brevity of description, constituents the same as or substantially similar to those discussed with reference to FIGS. 4A to 4E are allocated the same reference numerals thereto, and a repetitive explanation thereof will be omitted.

Figure 5A:
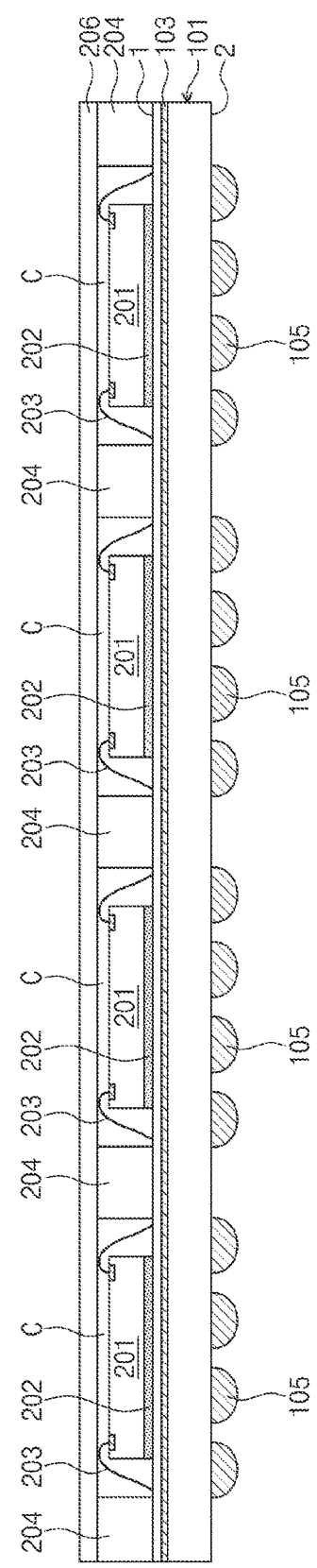
FIGS. 5A to 5E illustrate cross-sectional views showing a method of fabricating a semiconductor package according to an example embodiment of the inventive concepts.

Referring to FIG. 5A, a package substrate 101 may include a first top surface 1 and a bottom surface 2. The package substrate 101 may include a ground layer 103.

A plurality of semiconductor chips 201 may be formed on the first top surface 1 of the package substrate 101, while being spaced apart from each other at a regular interval. Each of the semiconductor chips 201 may be adhered through an adhesive layer 202 onto the package substrate 101. For example, the semiconductor chips 201 may be a light emitting chip, an optical sensor chip, or a lab-on-chip (LOC). A plurality of bonding wires 203 may be disposed between the package substrate 101 and each of the semiconductor chips 201.

A molding dam 204 may be formed on the first top surface 1 of the package substrate 101. The molding dam 204 may extend upward from an edge of the first top surface 1. The molding dam 204 may be spaced apart from each of the semiconductor chips 201. When viewed in a plan view, the molding dam 204 may surround each of the semiconductor chips 201.

A window layer 206 may be disposed on the molding dam 204 and the semiconductor chips 201. The molding dam 204 may support the window layer 206. The window layer 206 may be spaced apart from each of the semiconductor chips 201. The window layer 206 may be transparent. For example, the window layer 206 may include glass.

A plurality of cavities C may be defined by the first top surface 1, the molding dam 204, and the window layer 206. For example, the cavities C may be empty spaces surrounded by the first top surface 1, the molding dam 204, and the window layer 206. Each of the cavities C may receive therein one semiconductor chip 201.

A plurality of external terminals 105 may be formed on the bottom surface 2 of the package substrate 101.

Figure 5B:
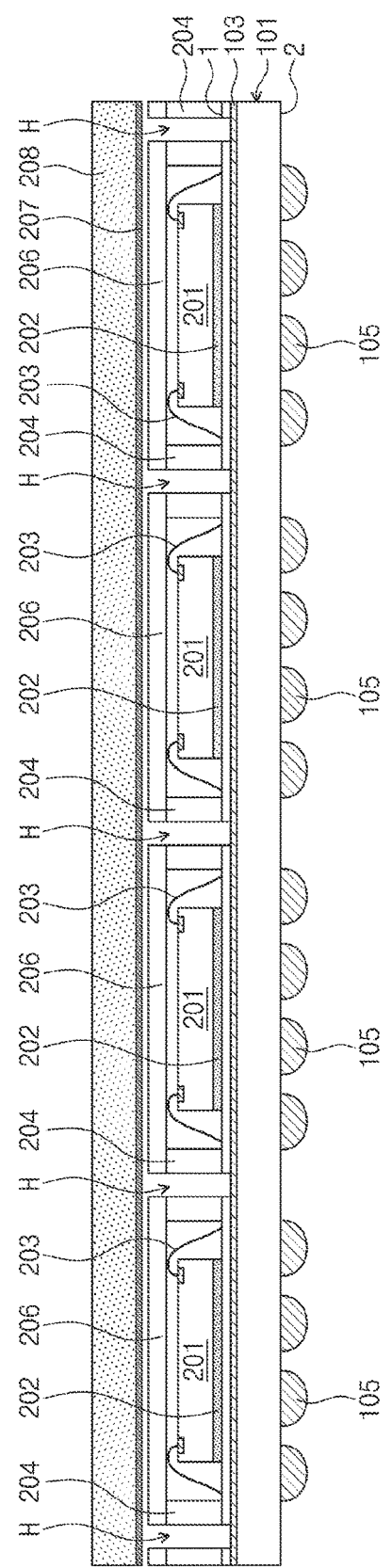

Referring to FIG. 5B, a cutting process may be performed on the molding dam 204, the window layer 206, and the package substrate 101. The cutting process may cut a portion of each of the molding dam 204, the window layer 206, and the package substrate 101, which is positioned between the semiconductor chips 201. The cutting process may partially cut an edge of each of the molding dam 204 and the window layer 206, and also partially cut an edge of the package substrate 101 overlapping the edges of the molding dam 204 and the window layer 206. The cutting process may form a groove H between a pair of neighboring semiconductor chips 201, and a pair of neighboring grooves H may define therebetween a region where a unit semiconductor package occupies. The cutting process may separate each of the molding dam 204 and the window layer 206 into a plurality of pieces.

The window layer 206 may be provided thereon with a functional layer 207 and a cushion layer 208 on the functional layer 207.

The functional layer 207 may be an electromagnetic shield layer. The functional layer 207 may include a conductive polymer 207a and an adhesive polymer 207b, as illustrated in FIG. 1B. The functional layer 207 may further include a conductive filler 207c, as illustrated in FIG. 1B. The conductive polymer 207a, the adhesive polymer 207b, and the conductive filler 207c may be irregularly arranged in the functional layer 207.

Figure 5C:
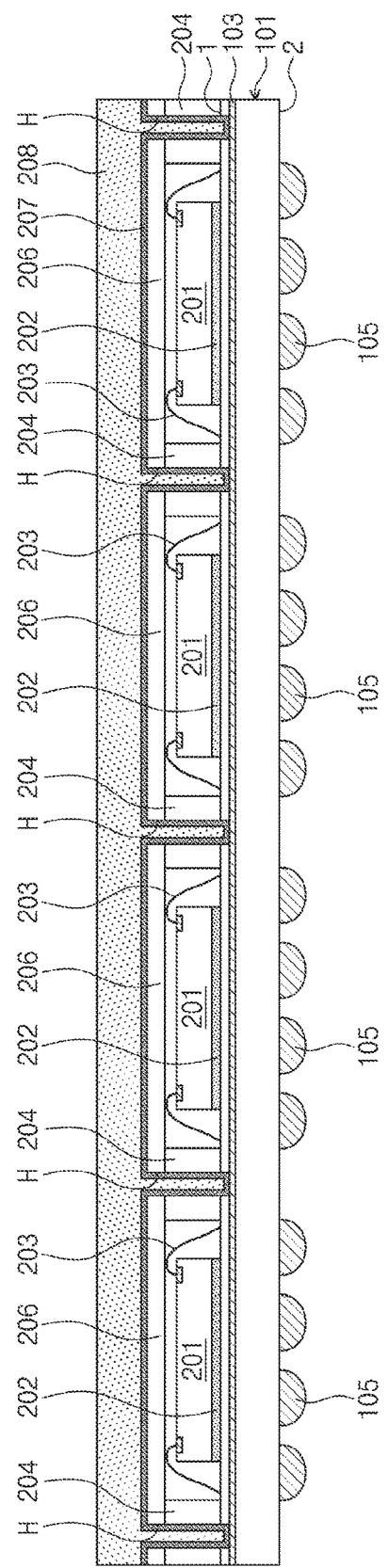

Referring to FIG. 5C, the functional layer 207 and the cushion layer 208 may be processed to fill the groove H and to cover the molding dams 204 and the window layer 206. For example, the functional layer 207 may conformally cover top surfaces of the window layer 206, lateral surfaces of the molding dams 204, and a floor surface of the groove H. The cushion layer 208 may cover the functional layer 207 and fill the groove H. A press process may be performed to cause the functional layer 207 and the cushion layer 208 to fill the groove H and to cover the surfaces of the window layer 206 and the molding dams 204.

Figure 5D:
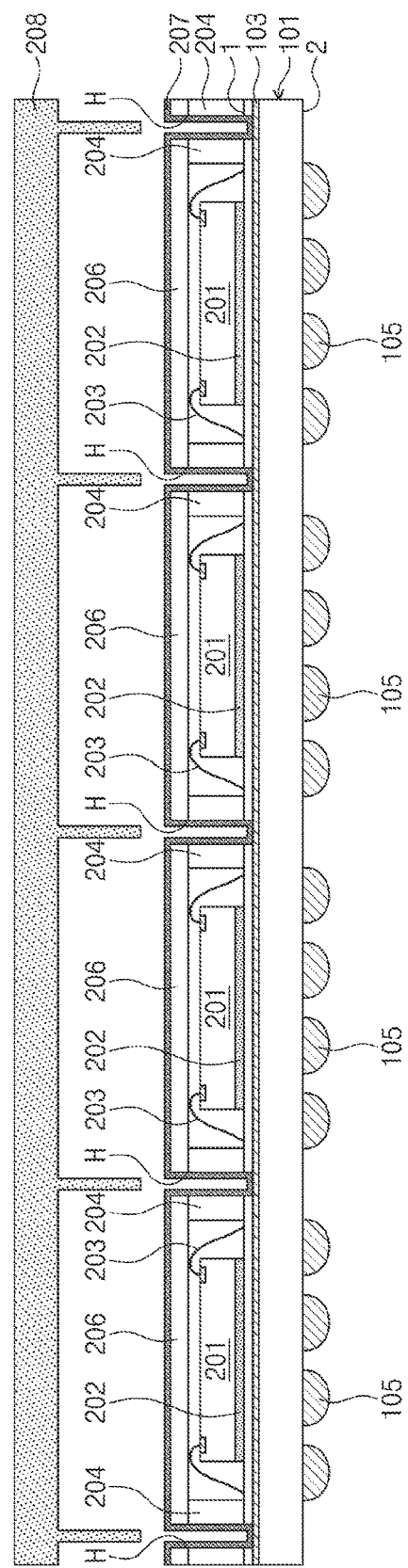

Referring to FIG. 5D, the cushion layer 208 may be removed from the functional layer 207. The functional layer 207 may remain on the floor surface of the groove H and on the surfaces of the window layer 206 and the molding dams 204. After the cushion layer 208 is removed, a curing process may be performed on the functional layer 207.

Figure 5E:
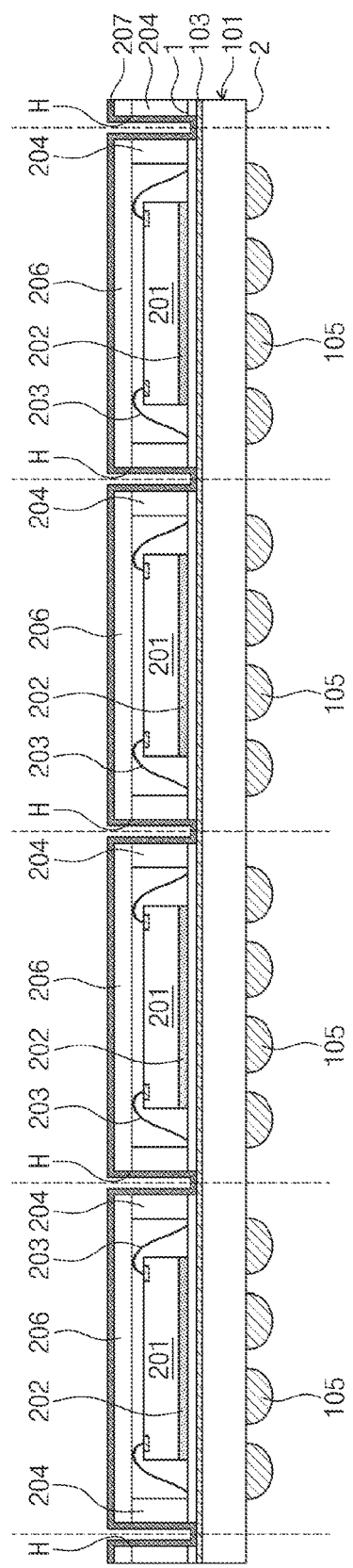

Referring to FIG. 5E, a package singulation process (sawing or sorting) may be performed within the groove H, thereby forming a plurality of semiconductor packages. If the package substrate 101 has a non-cut portion when the cutting process is performed, the package singulation process (sawing or sorting) may completely cut the non-cut portion of the package substrate 101.

Figure 6:
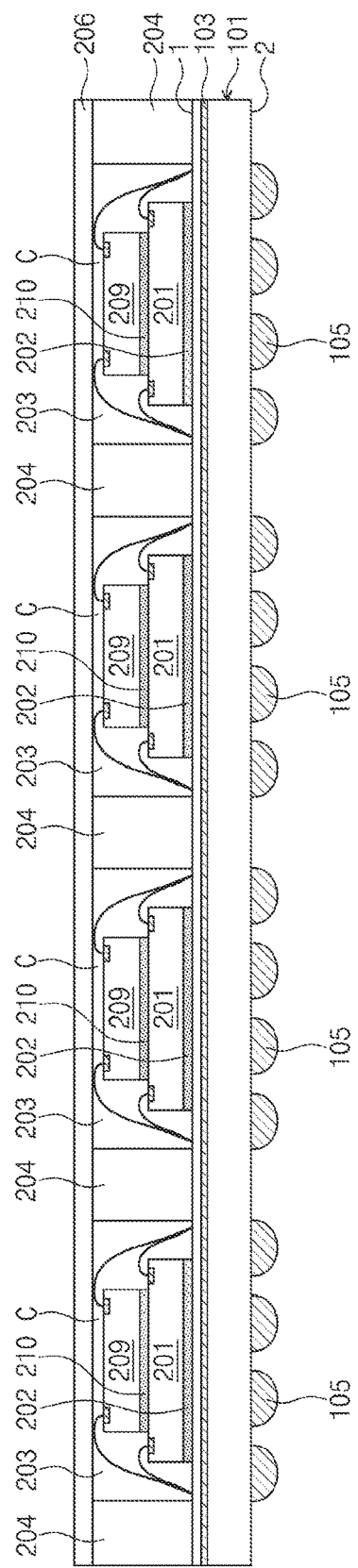
FIG. 6 illustrates a cross-sectional view showing a method of fabricating a semiconductor package according to an example embodiment of the inventive concepts.

FIG. 6 illustrates a cross-sectional view showing a method of fabricating a semiconductor package according to an example embodiment of the inventive concepts.

For brevity of description, constituents the same as or substantially similar to those discussed with reference to FIGS. 4A to 4E and 5A to 5E are allocated the same reference numerals thereto, and a repetitive explanation thereof will be omitted.

Referring to FIG. 6, a plurality of first semiconductor chips 201 may be provided on a first top surface 1 of a package substrate 101, while spaced apart from each other at a regular interval. Each of the first semiconductor chips 201 may be adhered through a first adhesive layer 202 onto the package substrate 101. For example, the first semiconductor chips 201 may be a semiconductor logic chip, a semiconductor memory chip, a system-on-chip (SOC), or a lab-on-chip (LOC). A plurality of bonding wires 203 may be disposed between the package substrate 101 and each of the first semiconductor chips 201.

A plurality of second semiconductor chips 209 may be disposed on top surfaces of the first semiconductor chip 201. Each of the second semiconductor chips 209 may be adhered through a second adhesive layer 210 to the top surfaces of the first semiconductor chips 201. For example, the second semiconductor chips 209 may be a light emitting chip, an optical sensor chip, or a lab-on-chip (LOC). A plurality of bonding wires 203 may be disposed between the package substrate 101 and each of the second semiconductor chips 209.

Although not shown, other semiconductor chips may further be disposed between the first and second semiconductor chips 201 and 209.

A molding dam 204 may be formed on the first top surface 1 of the package substrate 101.

A window layer 206 may be disposed on the molding dam 204 and the first and second semiconductor chips 201 and 209.

Figure 7A:
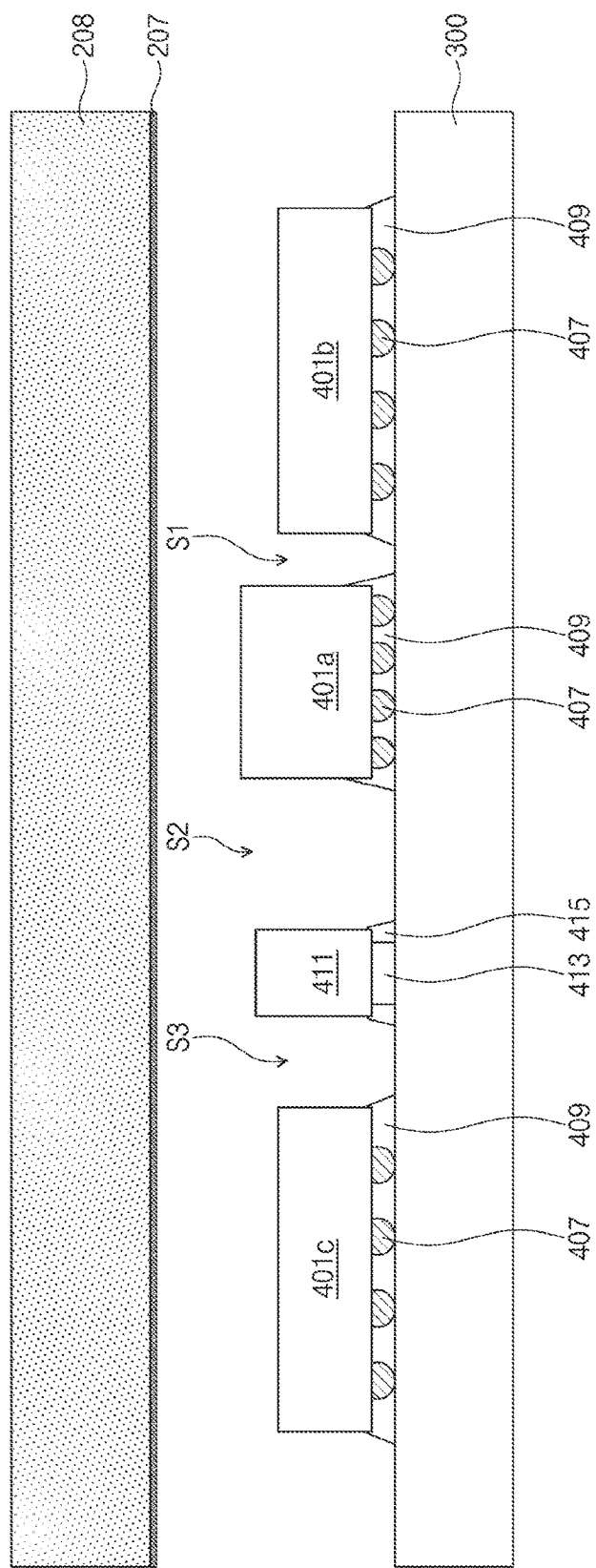
FIGS. 7A to 7C illustrate cross-sectional views showing a method of fabricating a semiconductor module according to an example embodiment of the inventive concepts.
Figure 7B:
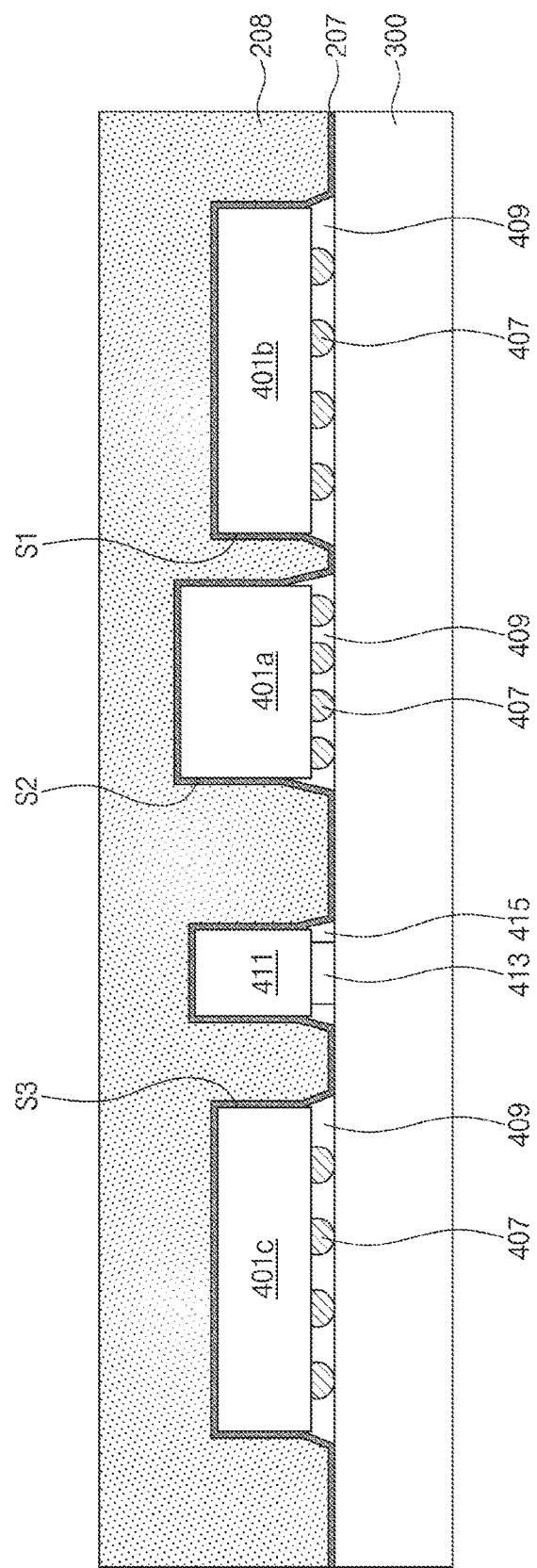
Figure 7C:
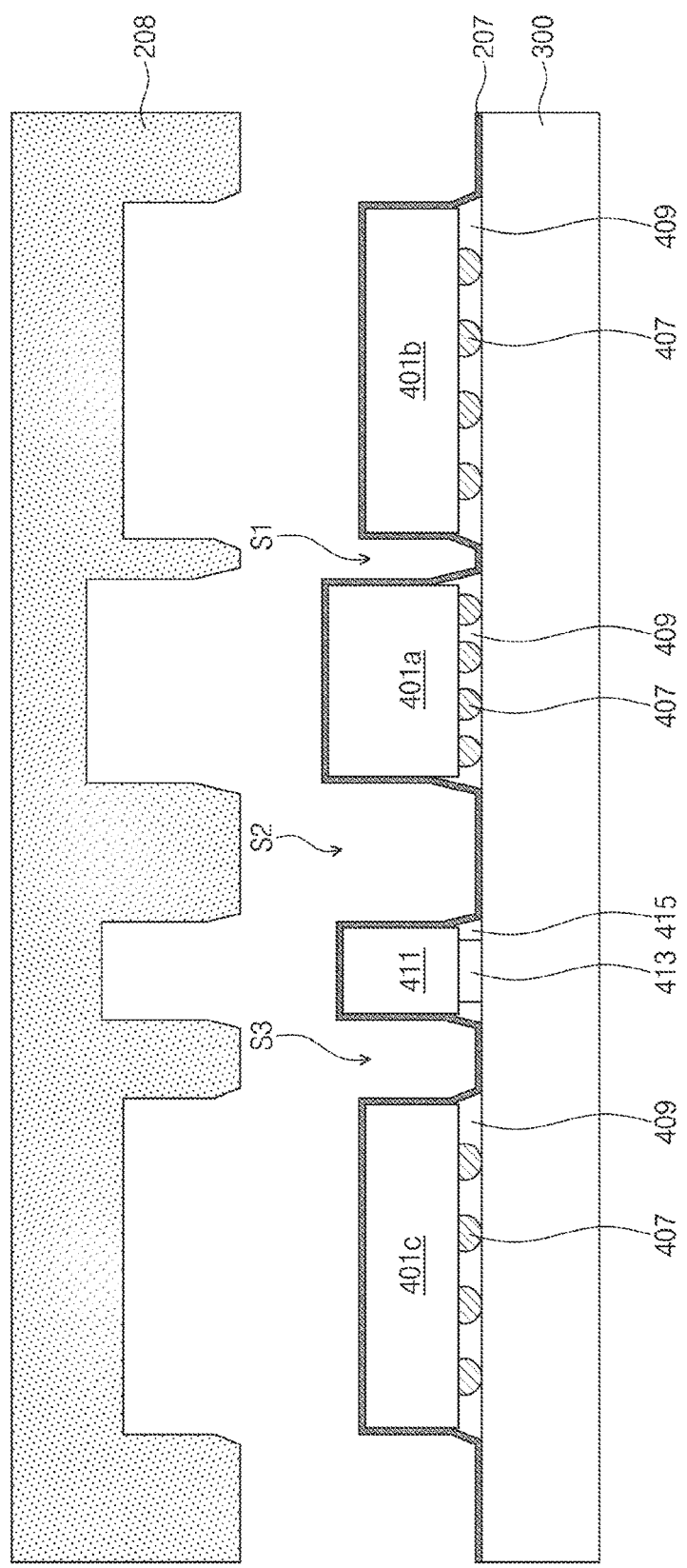

Identically or similarly to those discussed with reference to FIGS. 5B to 5E, a functional layer 207 may cover surfaces of the molding dams 204 and surfaces of the window layer 206, and a plurality of semiconductor packages may be fabricated FIGS. 7A to 7C illustrate cross-sectional views showing a method of fabricating a semiconductor module according to an example embodiment of the inventive concepts.

For brevity of description, constituents the same as or substantially similar to those discussed with reference to FIGS. 4A to 4E are allocated the same reference numerals thereto, and a repetitive explanation thereof will be omitted.

Referring to FIG. 7A, a component 411 and first, second, and third semiconductor chips 401a, 401b, and 401c may be provided on a module substrate 300. The module substrate 300 may be or include a printed circuit board (PCB) with a circuit pattern. The providing of the first, second, and third semiconductor chips 401a, 401b, and 401c on the module substrate 300 may include performing a soldering process to form solder balls 407 on active surfaces of the first, second, and third semiconductor chips 401a, 401b, and 401c, allowing the module substrate 300 to receive thereon the first, second, and third semiconductor chips 401a, 401b, and 401c on which the solder balls 407 are formed, and forming first under-fill resin layers 409 in spaces between the module substrate 300 and the first, second, and third semiconductor chips 401a, 401b, and 401c. The first, second, and third semiconductor chips 401a, 401b, and 401c may have different heights from each other. Each of the first, second, and third semiconductor chips 401a, 401b, and 401c may be a semiconductor logic chip, a semiconductor memory chip, a system-on-chip (SOC), or a lab-on-chip (LOC). For example, the first under-fill resin layers 409 may be formed of an under-fill material.

The component 411 may be attached to the module substrate 300 using an adhesive layer 413 provided therebetween. A second under-fill resin layer 415 may surround the adhesive layer 413 in a space between the components 411 and the module substrate 300. In some example embodiments, the component 411 may be soldered onto the module substrate 300. The component 411 may have a height different from those of the first, second, and third semiconductor chips 401a, 401b, and 401c. The component 411 may be replaced with a resistor, an inductor, a transformer, a passive device, or other electrical devices. The second under-fill resin layer 415 may be formed of, for example, an under-fill material.

A functional layer 207 and a cushion layer 208 on the functional layer 207 may be disposed on the first, second, and third semiconductor chips 401a, 401b, and 401c, the component 411, and a top surface of the module substrate 300.

The functional layer 207 may be an electromagnetic shield layer. The functional layer 207 may include a conductive polymer 207a and an adhesive polymer 207b, as illustrated in FIG. 1B. The functional layer 207 may further include a conductive filler 207c, as illustrated in FIG. 1B. The conductive polymer 207a, the adhesive polymer 207b, and the conductive filler 207c may be irregularly arranged in the functional layer 207.

Referring to FIG. 7B, the functional layer 207 and the cushion layer 208 may be processed to cover the first, second, and third semiconductor chips 401a, 401b, and 401c, the component 411, the first under-fill resin layers 409, and the second under-fill resin layer 415, and also to fill first, second, and third spaces S1, S2, and S3.

For example, the functional layer 207 may conformally cover top and lateral surfaces of the first, second, and third semiconductor chips 401a, 401b, and 401c, top and lateral surfaces of the component 411, surfaces of the first under-fill resin layers 409, and a surface of the second under-fill resin layer 415. The functional layer 207 may also cover a portion (e.g., first space S1) of a top surface of the module substrate 300 exposed between the first semiconductor chip 401a and the second semiconductor chip 401b, a portion (e.g., second space S2) of a top surface of the module substrate 300 exposed between the first semiconductor chip 401a and the component 411, and a portion (e.g., third space S3) of a top surface of the module substrate 300 exposed between the component 411 and third semiconductor chip 401c. The cushion layer 208 may cover the functional layer 207, and fill the first, second, and third spaces S1, S2, and S3.

A press process may be performed to cause the functional layer 207 and the cushion layer 208 to cover the first, second, and third semiconductor chips 401a, 401b, and 401c and the component 411, and also to fill the first, second, and third spaces S1, S2, and S3. Each of the first, second, and third spaces S1, S2, and S3 may have an aspect ratio equal to or less than about 5.

Referring to FIG. 7C, the cushion layer 208 may be removed from the functional layer 207. The functional layer 207 may remain on the surfaces of the first, second, and third semiconductor chips 401a, 401b, and 401c, the surface of the component 411, the surfaces of the first under-fill resin layers 409, the surface of the second under-fill resin layer 415, and the top surface of the module substrate 300 exposed to the first, second, and third spaces S1, S2, and S3.

According to some example embodiments of inventive concepts, the functional layer 207 may be formed to cover the surfaces of the first, second, and third semiconductor chips 401a to 401c and the surface of the component 411, and at the same time, to conformally cover floor surfaces of the first, second, and third spaces S1, S2, and S3 among the component 411 and the first, second, and third semiconductor chips 401a, 401b, and 401c, thereby resulting in a reduced process time.

Figure 8:
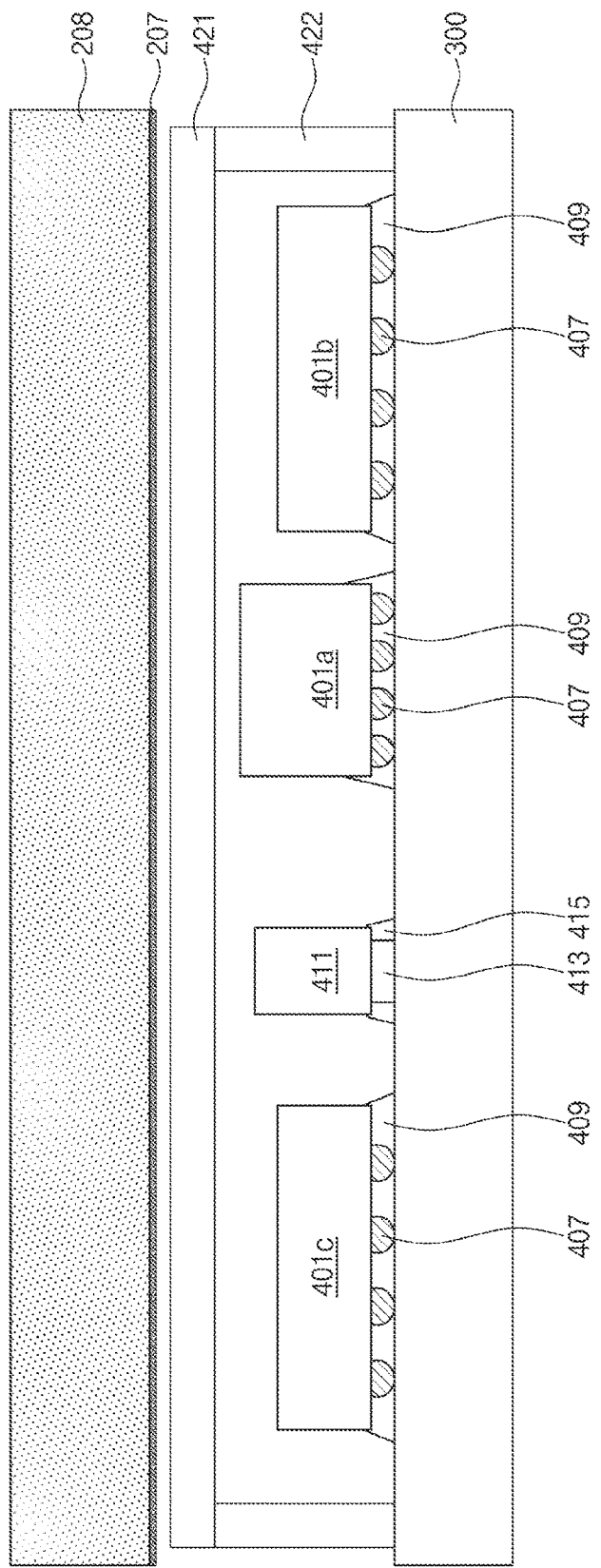
FIG. 8 illustrates a cross-sectional view showing a method of fabricating a semiconductor module according to an example embodiment of the inventive concepts.

FIG. 8 illustrates a cross-sectional view showing a method of fabricating a semiconductor module according to an example embodiment of the inventive concepts.

For brevity of description, constituents the same as or substantially similar to those discussed with reference to FIGS. 4A to 4E and 7A to 7C are allocated the same reference numerals thereto, and a repetitive explanation thereof will be omitted.

Referring to FIG. 8, a component 411 and first, second, and third semiconductor chips 401a, 401b, and 401c may be provided on a module substrate 300. Each of the first, second, and third semiconductor chips 401a, 401b, and 401c may be a light emitting chip, an optical sensor chip, or a lab-on-chip (LOC).

A molding dam 422 may be formed on a top surface of the module substrate 300. The molding dam 422 may extend upward from a top surface of an edge of the module substrate 300. When viewed in a plan view, the molding dam 422 may surround the component 411 and the first, second, and third semiconductor chips 401a, 401b, and 401c.

A window layer 421 may be disposed on the molding dam 422, the first, second, and third semiconductor chips 401a, 401b, and 401c, and the component 411. The molding dam 422 may support the window layer 421. The window layer 421 may be spaced apart from the component 411 and from the first, second, and third semiconductor chips 401a, 401b, and 401c. The window layer 421 may be transparent. For example, the window layer 421 may include glass.

A functional layer 207 may be provided on the molding dam 422 and the window layer 421, and a cushion layer 208 may be provided on the functional layer 207. Identically or similarly to those discussed with reference to FIGS. 7B and 7C, the functional layer 207 may cover the window layer 421, the molding dam 422, and the top surface of the module substrate 300.

According to inventive concepts, a semiconductor package may include a functional layer that shields electromagnetic waves and causes the semiconductor package to be fabricated at a low cost and to have a smaller thickness, thereby reducing environmental and residue issues.

Furthermore, the functional layer may be transparent such that a mark displayed on a semiconductor chip may be visually recognized.

Although the present inventive concepts have been described in connection with some example embodiments of the inventive concepts illustrated in the accompanying drawings, it will be understood to those skilled in the art that various changes and modifications may be made without departing from the technical spirit and essential feature of the inventive concepts. It will be apparent to those skilled in the art that various substitution, modifications, and changes may be thereto without departing from the scope and spirit of the inventive concepts.

What is claimed is:

1. A semiconductor package comprising:
a package substrate including an insulating layer and a ground layer, the ground layer longitudinally extending in the insulating layer, an end portion of the ground layer exposed by the insulating layer;
a semiconductor chip on the package substrate;
a molding layer on the package substrate and surrounding at least a side surface of the semiconductor chip; and
an electromagnetic shield layer covering the molding layer and the semiconductor chip, an end portion of the electromagnetic shield layer running in parallel with and being in contact with the end portion of the ground layer, the electromagnetic shield layer including a first lateral portion and a second lateral portion, the first lateral portion facing the side surface of the semiconductor chip, the second lateral portion at an end of the electromagnetic shield layer and horizontally spaced apart from the first lateral portion, the second lateral portion of the electromagnetic shield layer and a lateral end surface of the ground layer being on a substantially straight line and exposed to outside of the package substrate,
wherein the electromagnetic shield layer includes a conductive polymer and an adhesive polymer.

2. The semiconductor package of claim 1, wherein the electromagnetic shield layer is a transparent layer.

3. The semiconductor package of claim 1, wherein the electromagnetic shield layer has a visible light transmittance of about 90% or higher.

4. The semiconductor package of claim 1, wherein the conductive polymer has an electronic conductivity between about 500 S/cm and about 2,000 S/cm.

5. The semiconductor package of claim 1, wherein the conductive polymer has a visible light transmittance equal to or higher than about 90%.

6. The semiconductor package of claim 1, wherein the conductive polymer includes one or more of poly(3,4-ethylenedioxythiophene) (PEDOT), poly(3,4-ethylenedioxythiophene) (PEDOT): sodium poly-styrenesulfonate) (PSS), or poly(4,4-dioctyl cyclopentadithiophene).

7. The semiconductor package of claim 1, wherein the adhesive polymer includes at least one of acrylic polymer based on mesoporous or acrylic microemulsion.

8. The semiconductor package of claim 1, wherein the adhesive polymer includes a photo-initiator.

9. The semiconductor package of claim 1, wherein the electromagnetic shield layer further includes a conductive filler.

10. The semiconductor package of claim 9, wherein the conductive filler includes a transparent conductive oxide.

11. The semiconductor package of claim 9, wherein the conductive filler includes an inorganic material including at least one of IZO, ITO, AZO or includes an organic material including at least one of CNT or graphene.

12. A semiconductor package comprising:
a package substrate including an insulating layer and a ground layer, the ground layer longitudinally extending in the insulating layer, an end portion of the ground layer exposed by the insulating layer;
a semiconductor chip on the package substrate;
a molding dam extending upward from a top surface of the package substrate, the molding dam horizontally spaced apart from the semiconductor chip,
a window layer supported by the molding dam, the window layer and the molding dam enclosing the semiconductor chip on the package substrate, the window layer being transparent; and
an electromagnetic shield layer covering the molding dam and the window layer, the electromagnetic shield layer including an end portion that runs in parallel with and is in contact with the exposed end portion of the ground layer, the electromagnetic shield layer including a first lateral portion and a second lateral portion, the first lateral portion facing a side surface of the semiconductor chip, the second lateral portion at an end of the electromagnetic shield layer and horizontally spaced apart from the first lateral portion, the second lateral portion of the electromagnetic shield layer and a lateral end surface of the ground layer being on a substantially straight line and exposed to outside of the package substrate.

13. The semiconductor package of claim 12, wherein a top surface of the molding dam is at a higher position than a top of the semiconductor chip.

14. The semiconductor package of claim 12, wherein a width of the molding dam that is a distance between both outer sidewalls of the molding dam is less than a width of the package substrate when viewed in a cross-section.

15. The semiconductor package of claim 12, wherein the electromagnetic shield layer is a transparent layer, through which a mark on the semiconductor chip is visible.

16. The semiconductor package of claim 15, wherein the electromagnetic shield layer includes a conductive polymer and an adhesive polymer.

17. The semiconductor package of claim 16, wherein the electromagnetic shield layer further includes a conductive filler.

* * * * *